(12) United States Patent
Horikawa

(10) Patent No.: US 8,708,711 B2
(45) Date of Patent: Apr. 29, 2014

(54) CONNECTING TERMINAL STRUCTURE, SOCKET AND ELECTRONIC PACKAGE

(75) Inventor: Yasuyoshi Horikawa, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 126 days.

(21) Appl. No.: 13/433,841

(22) Filed: Mar. 29, 2012

(65) Prior Publication Data

US 2012/0258636 A1    Oct. 11, 2012

(30) Foreign Application Priority Data

Apr. 11, 2011 (JP) ................................ 2011-087156

(51) Int. Cl.
  *H01R 12/00* (2006.01)
(52) U.S. Cl.
  USPC ............................................. 439/66; 439/71
(58) Field of Classification Search
  USPC ..................... 439/66, 70, 71, 81, 91
  See application file for complete search history.

(56) References Cited

U.S. PATENT DOCUMENTS

| 7,264,486 | B2 | 9/2007 | Ma | |
| 7,371,073 | B2 | 5/2008 | Williams | |
| 7,438,557 | B1 * | 10/2008 | Plucinski et al. | 439/65 |
| 7,740,488 | B2 * | 6/2010 | Taylor | 439/66 |
| 7,762,819 | B2 * | 7/2010 | Mori et al. | 439/66 |
| 7,766,667 | B2 * | 8/2010 | Russell | 439/66 |
| 7,845,954 | B2 * | 12/2010 | Tomura et al. | 439/66 |
| 7,931,476 | B2 * | 4/2011 | Russell | 439/66 |
| 8,123,529 | B2 * | 2/2012 | Beaman | 439/66 |
| 8,133,061 | B1 * | 3/2012 | Ayers et al. | 439/66 |
| 8,152,535 | B2 * | 4/2012 | Ihara | 439/66 |
| 8,179,692 | B2 * | 5/2012 | Ihara | 361/787 |

* cited by examiner

*Primary Examiner* — Thanh Tam Le
(74) *Attorney, Agent, or Firm* — IPUSA, PLLC

(57) ABSTRACT

A connecting terminal structure includes a supporting body; a plurality of first electrode pads provided on a first side of the supporting body; a plurality of second electrode pads provided on a second side of the supporting body; a flexible substrate configured to electrically connect the first electrode pads to the second electrode pads; and a plurality of connecting terminals joined to at least one of the first electrode pads and the second electrode pads.

8 Claims, 21 Drawing Sheets

CONNECTING TERMINAL STRUCTURE, SOCKET AND ELECTRONIC PACKAGE

CROSS-REFERENCE TO RELATED APPLICATIONS

This patent application is based upon and claims the benefit of priority of Japanese Patent Application No. 2011-087156 filed on Apr. 11, 2011, the entire contents of which are incorporated herein by reference.

FIELD

The embodiments discussed herein are related to a connecting terminal structure formed by providing connecting terminals in a substrate, a socket having the connecting terminal structure, and an electronic package having a connecting terminal structure.

BACKGROUND

U.S. Pat. No. 7,264,486 discloses an electrical connector including an insulative housing defining a number of passageways and a number of conductive terminals residing in corresponding passageways, respectively. The conductive terminals each include a securing part extending along a lengthwise direction of the passageways, a connecting part extending upwardly from the securing part, a transitional part extending from the other end of the securing part towards the printed circuit board, a solder part formed on a distal end of the transitional part. The securing part defines a wider securing surface. A partial projection of the transitional part projected on a plane defined by the securing surface is separated an angle with a direction of the terminals being inserted.

U.S. Pat. No. 7,371,073 discloses a scalable, low cost, reliable, compliant, low profile, low insertion force, high-density, separable and reconnectable connector for high speed, high performance electronic circuitry and semiconductors. The electrical connector can be used to make, for example, electrical connections from components such as a Printed Circuit Board (PCB) to another PCB, MPU, NPU, or other semiconductor device.

SUMMARY

According to an aspect of the embodiment, a connecting terminal structure includes a supporting body; a plurality of first electrode pads provided on a first side of the supporting body; a plurality of second electrode pads provided on a second side of the supporting body; a flexible substrate configured to electrically connect the first electrode pads to the second electrode pads; and a plurality of connecting terminals joined to at least one of the first electrode pads and the second electrode pads.

The object and advantages of the invention will be realized and attained by means of the elements and combinations particularly pointed out in the appended claims.

It is to be understood that both the foregoing general description and the following detailed description are exemplary and explanatory and are not restrictive of the invention as claimed.

DESCRIPTION OF EMBODIMENTS

Figure 1:
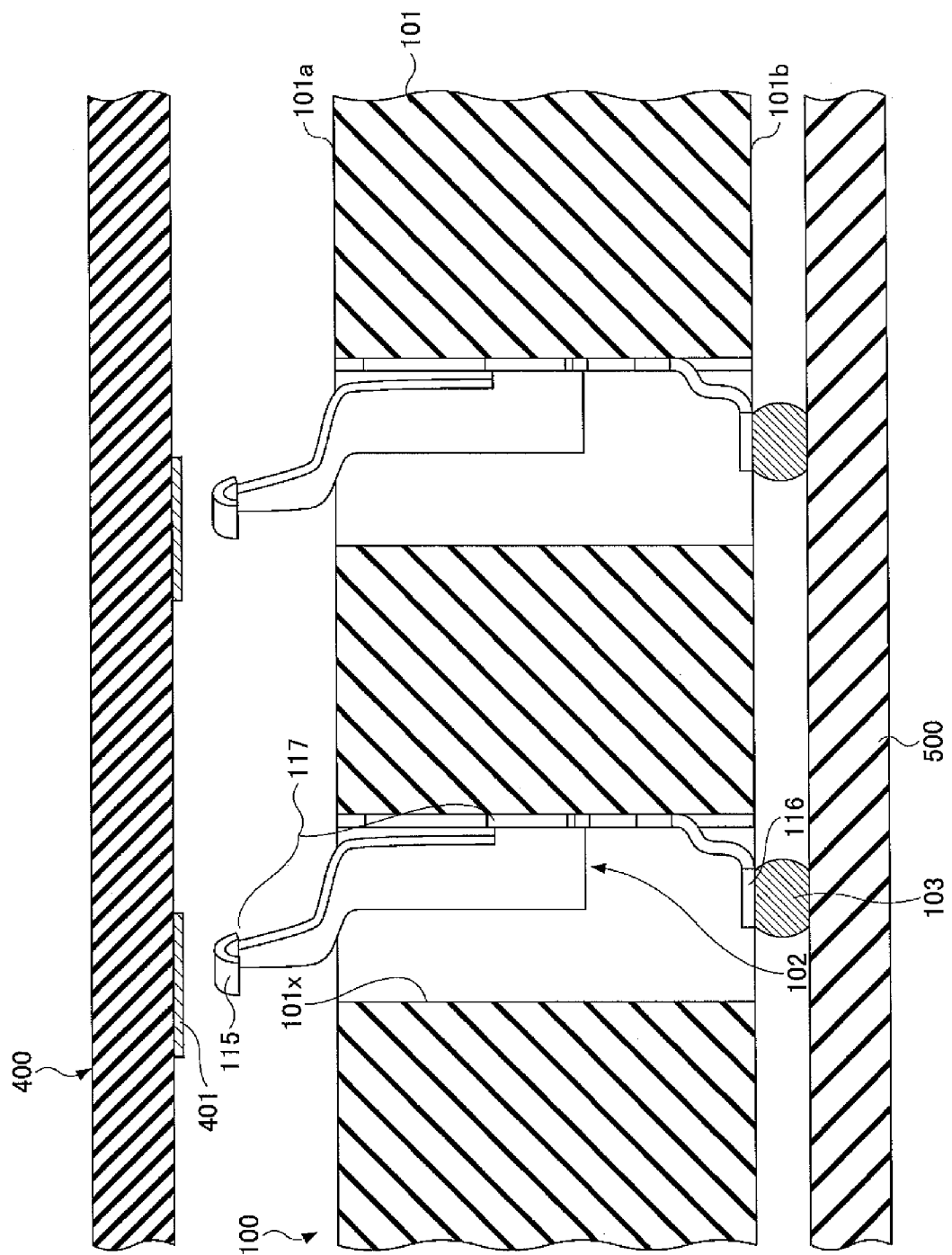
FIG. 1 is a cross-sectional view of an exemplary socket.

A socket may be provided to electrically connecting an object to be connected to a mounting board. FIG. 1 is a cross-sectional view of an exemplary socket. Referring to FIG. 1, a socket 100 includes a housing 101 made of a formed resin and conductive connecting terminals 102 having elasticity.

Plural through holes 101x are arranged at a predetermined pitch in the housing 101. The connecting terminal 102 is integrally formed to have connecting parts 115 and 116 and a spring part 117. The connecting terminal 102 is fixed inside the through hole 101x opened in the housing 101. The connecting part 115 protrudes from one surface 101a of the housing 101, and the connecting part 116 is exposed from the other surface 101b of the housing 101.

The connecting part 116 is electrically connected to a mounting board 500 such as a motherboard via a bump 103. When an object to be connected 400 (e.g., a wiring board and a semiconductor package) including an electrode pad 401 is pushed in a direction toward the socket 100, the connecting part 115 contacts the electrode pad 401. With this, the socket 100 is electrically connected to the object to be connected 400. Said differently, the object to be connected 400 is electrically connected to the mounting board 500 such as the motherboard via the socket 100.

Figure 2:
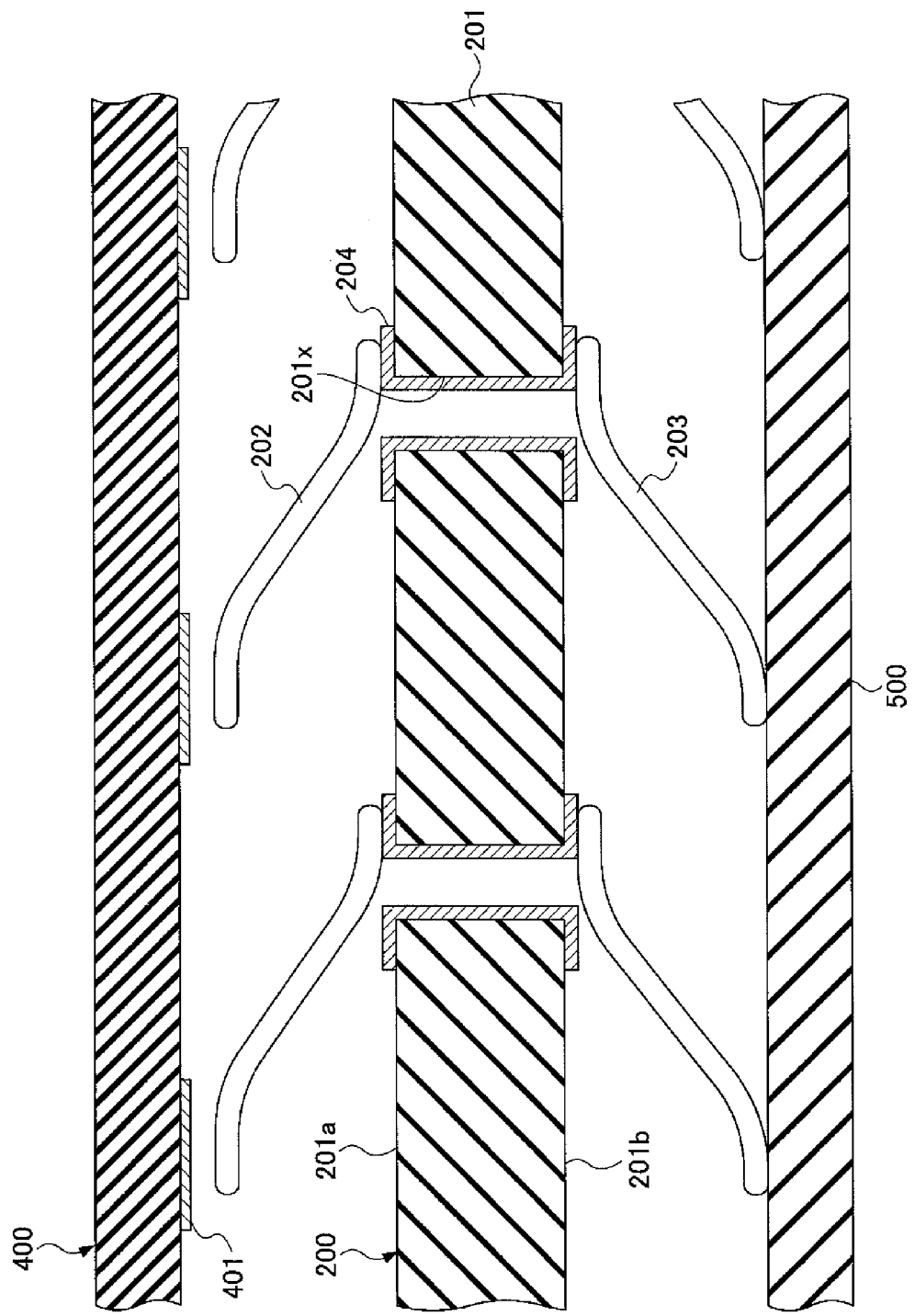
FIG. 2 is a cross-sectional view of an exemplary socket.

FIG. 2 is a cross-sectional view of another exemplary socket. Referring to FIG. 2, an exemplary socket 200 includes a substrate 201, and conductive connecting terminals 202 and 203 having a spring property. Plural through holes 201x are arranged at a predetermined pitch in the substrate 201. A wiring 204 is provided on one surface 201a of the substrate 201 and extends to the other surface 201b via the through hole 201x.

One end of the connecting terminal 202 is fixed to the wiring 204 formed on the one surface 201a of the substrate 201. The other end of the connecting terminal 202 is connectable to the electrode pad 401 of the object to be connected 400. One end of the connecting terminal 203 is fixed to the wiring 204 formed on the other surface 201b of the substrate 201. The other end of the connecting terminal 203 is electrically connected to the mounting board 500 such as a motherboard. The connecting terminal 202 and the connecting terminal 203 may have the same features.

When the object to be connected 400 (e.g., a wiring board and a semiconductor package) including the electrode pad 401 is pushed in the direction toward the socket 200, the other end of the connecting terminal 202 contacts the electrode pad 401. With this, the socket 200 is electrically connected to the object to be connected 400. Said differently, the object to be connected 400 is electrically connected to the mounting board 500 such as the motherboard via the socket 200.

Referring to FIG. 1, the overall height of the socket 100 may be influenced by the height of the connecting terminal 102. Said differently, when the object to be connected 400 is electrically connected to the mounting board 500 such as a motherboard via the socket 100, an interval between the object to be connected 400 and the mounting board 500 may be determined by the height of the connecting terminal 102. For example, in a case where a high semiconductor chip, a capacitor or the like is mounted on a side of the socket 100 of the object to be connected 400, and an interval between the object to be connected 400 and the mounting board 500 is widened more than the state illustrated in FIG. 1, time and effort occur for changing the shape of the connecting terminal 102 or the like.

Referring to FIG. 2, the overall height of the socket 200 is determined by the heights of the connecting terminals 202 and 203 and the thickness of the substrate 201. For example, in a case where a high semiconductor chip, a capacitor or the like is mounted on a side of the socket 200 of the object to be connected 400, and an interval between the object to be connected 400 and the mounting board 500 is widened more than the state illustrated in FIG. 2, the shape of the connecting terminal 202 or the like may not be changed as long as the substrate 201 is thickened. However, if the substrate 201 is thickened, the wiring 204 inside the through hole 201x is elongated to thereby possibly affect high speed signal propagation.

In the sockets 100 and 200, it is difficult to minutely adjust the overall height of the sockets. Therefore, it is not possible to flexibly deal with the case where the interval between the object to be connected 400 and the mounting board 500 is changed.

Preferred embodiments of the present invention will be described with reference to accompanying drawings. The same reference numerals may be provided to the corresponding parts in the figures and description of these parts may be omitted.

In the following embodiments and modified examples of the embodiments, cases where shapes of semiconductor packages and substrates are rectangular in their plan views are described. However, the plan views of the semiconductor packages and the substrates are not limited thereto and may have arbitrary shapes.

[a] First Embodiment

[Connecting Terminal Structure of the First Embodiment]

Figure 3:
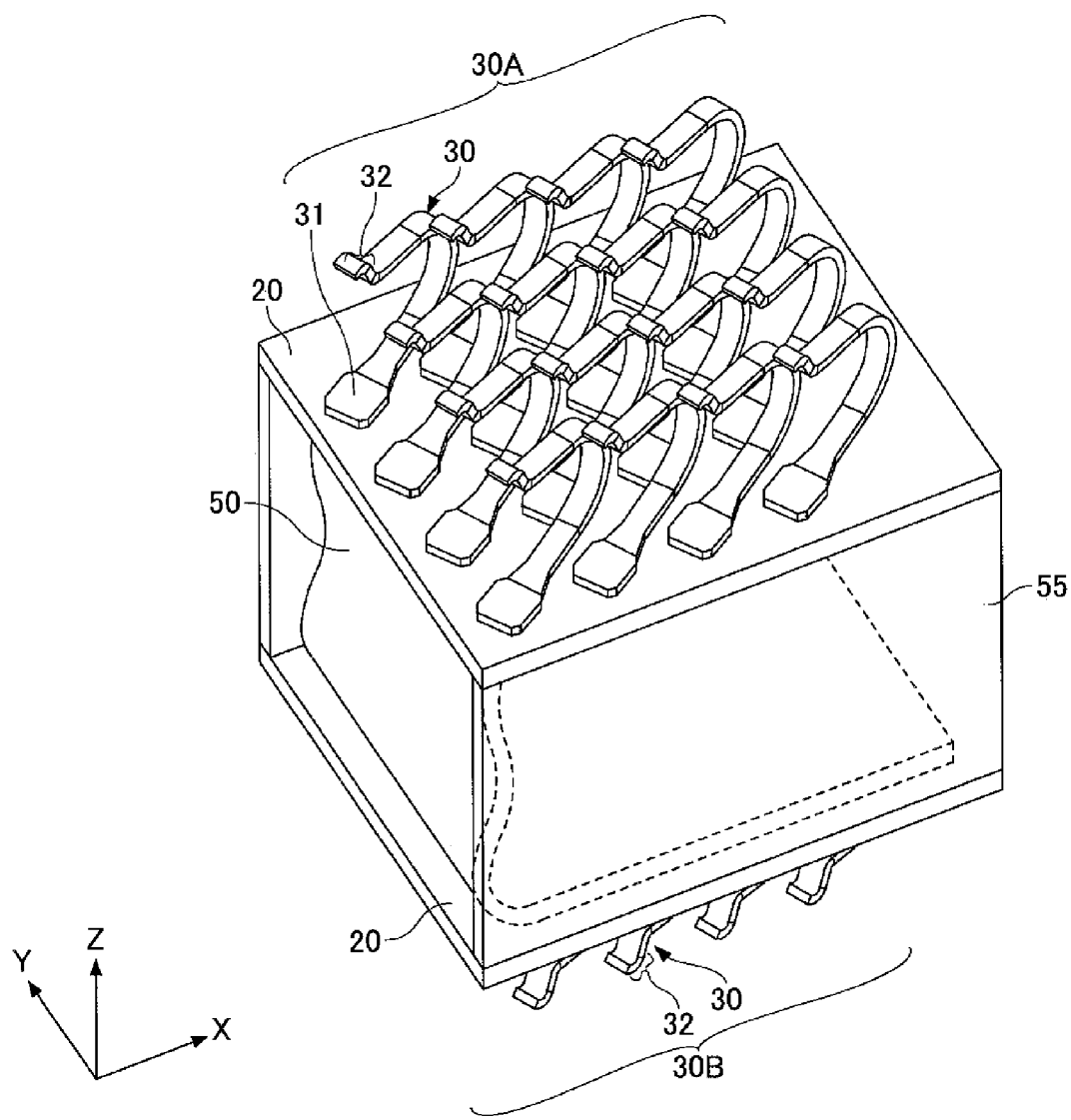
FIG. 3 is a perspective view of a connecting terminal structure of a first embodiment.
Figure 4:
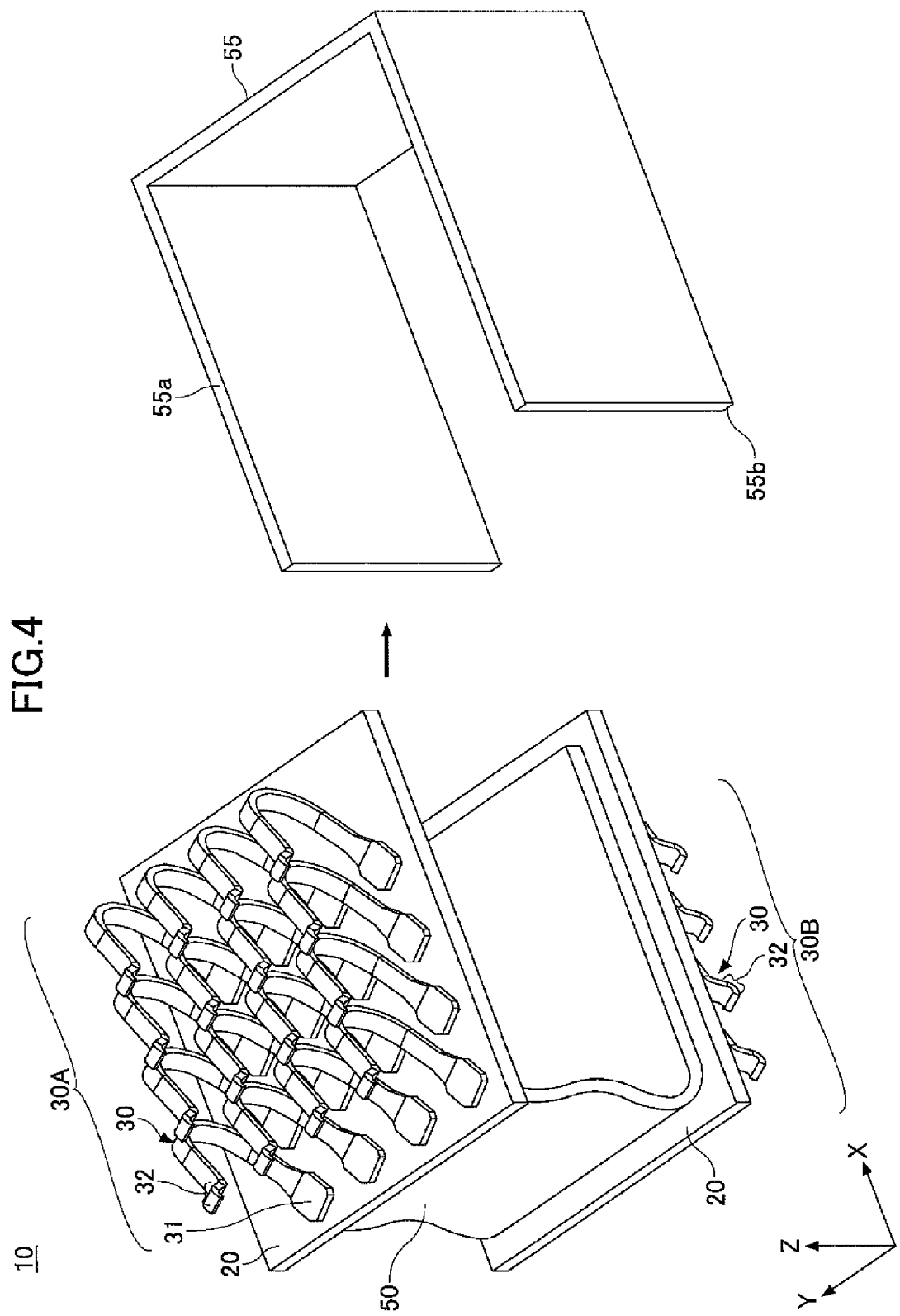
FIG. 4 is an exploded perspective view of the connecting terminal structure of the first embodiment.
Figure 5:
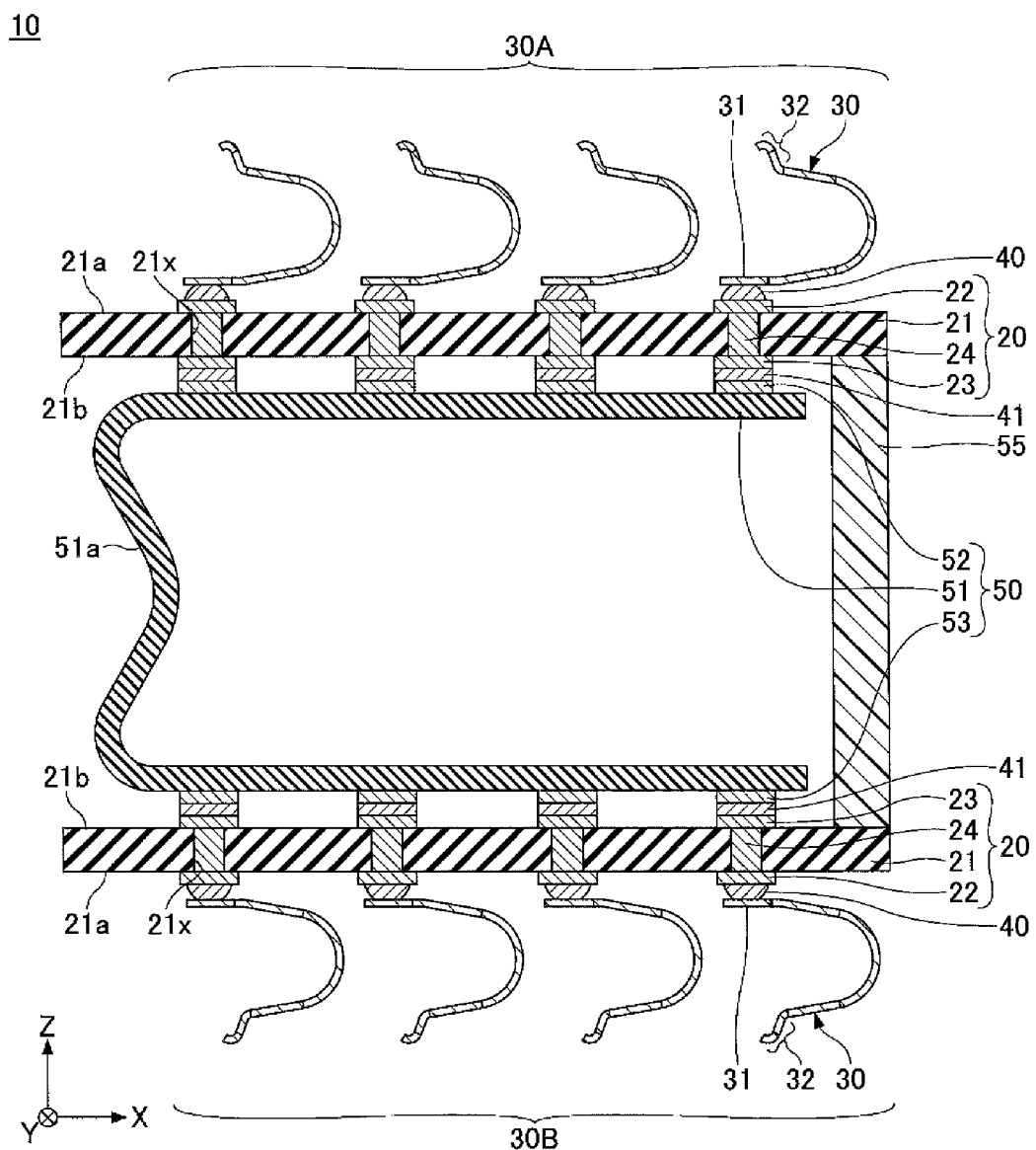
FIG. 5 is a cross-sectional view of the connecting terminal structure of the first embodiment.
Figure 6:
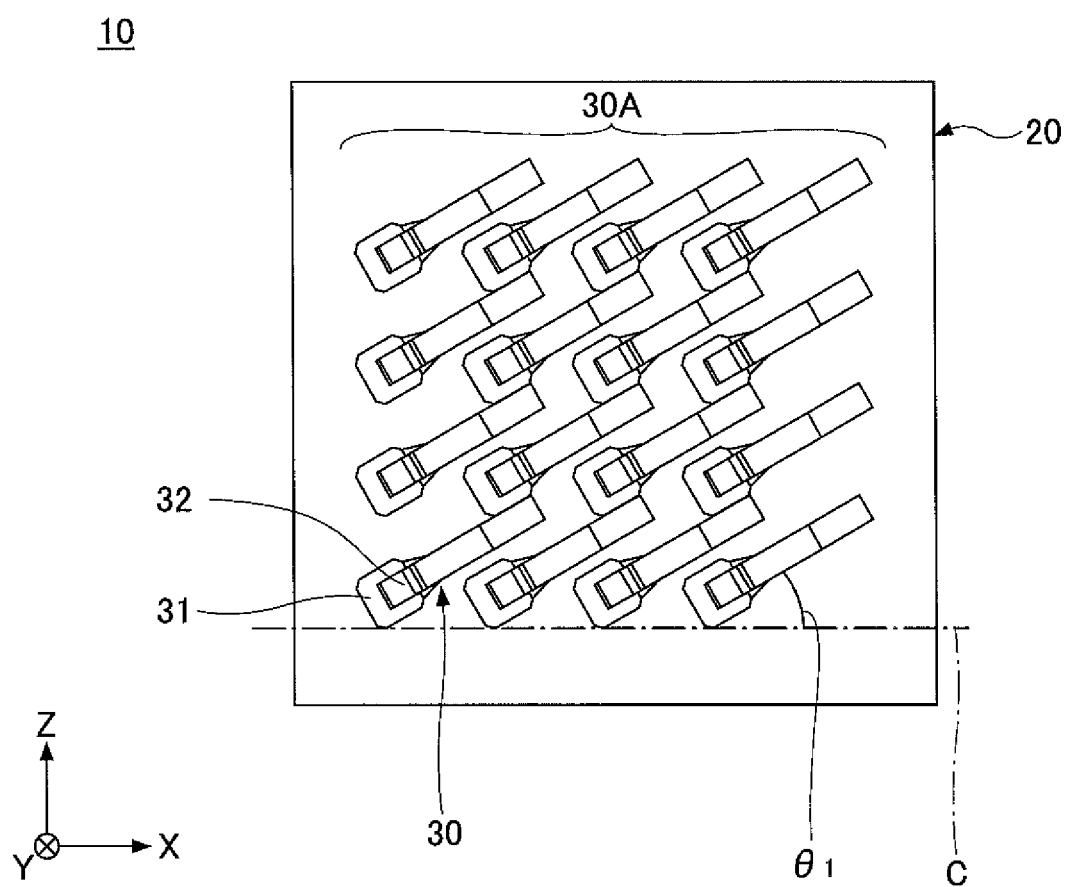
FIG. 6 is a plan view of the connecting terminal of the first embodiment.

FIG. 3 is a perspective view of a connecting terminal structure of the first embodiment. FIG. 4 is an exploded perspective view of the connecting terminal structure of the first embodiment. FIG. 5 is a cross-sectional view of the connecting terminal structure of the first embodiment. FIG. 6 is a plan view of the connecting terminal structure of the first embodiment. FIG. 5 is the cross-sectional view parallel to a direction of arranging the connecting terminals 30 illustrated in FIG. 6. However, referring to FIG. 6, the connecting terminals 30 are not arranged in parallel with an arranging direction C in their plan views, so that a cross-sectional view parallel to the arranging direction C does not properly illustrate cross-sectional shapes of the connecting terminals 30. For convenience, FIG. 5 schematically illustrates cross-sectional shapes of the connecting terminals in parallel with the direction slanted by $\theta_1$ with respect to the arranging direction C. Cross-sectional views similar to FIG. 5 are adopted in the following figures.

Referring to FIG. 3 to FIG. 6, the connecting terminal structure 10 may include two substrates 20, a connecting terminal group 30A, a connecting terminal group 30B, joining parts 40 and 41, a flexible substrate 50 and a supporting body 55.

In the connecting terminal structure 10, the connecting terminal group 30A is joined to one end of the flexible substrate 50 via one of the substrates 20. The connecting terminal group 30B is joined to the other end of the flexible substrate 50 via the other one of the substrates 20. The one of the substrates 20 and the other one of the substrates 20 are fixed to the supporting body 55 so as to be substantially parallel to each other. Connecting parts 32 of the connecting terminals 30 in the connecting terminal group 30A point in an opposite direction of connecting parts 32 of the connecting terminals 30 in the connecting terminal group 30B. The number of the connecting terminals 30 in the connecting terminal group 30A and the number of the connecting terminals 30 in the connecting terminal group 30B are the same, and the connecting terminals 30 in the connecting terminal group 30A and the connecting terminals 30 in the connecting terminal group 30B are arranged under the same arrangement rule. Constituent elements of the connecting terminal structure 10 are described in detail.

The substrate 20 includes a substrate body 21, plural electrode pads 22 formed on one surface 21a of the substrate body 21, plural electrode pads 23 formed on the other surface 21b, and through wirings 24 formed inside through holes 21x penetrating from the one surface 21a to the other surface 21b of the substrate body 21. For example, the electrode pads 22 are arranged in a periphery-like shape (along a periphery of the substrate 20) or in an area array-like shape (on an entire surface of the substrate) in response to positions of the connecting terminals 30. The electrode pads 23 are arranged at positions opposite to the electrode pads 22 corresponding to the electrode. The electrode pads 22 and the electrode pads 23 are electrically connected via the through wirings 24.

The substrate bodies 21 are base bodies to which the connecting terminals 30 are fixed. The substrate bodies 21 may be a rigid substrate such as a FR4 material, which is made of glass cloth impregnated with an epoxy resin or the like. For example, the plan view of the substrate body 21 may be rectangular. The thickness of the substrate is, for example, 0.2 to 0.8 mm.

The materials of the electrode pads 22, the electrode pads 23 and the through wirings 24 are copper (Cu) or the like. The thicknesses of the electrode pads 22 and the electrode pads 23 are, for example, 5 to 10 µm. The electrode pads 22, the electrode pads 23 and the through wirings 24 may be formed by various wiring forming methods such as a semi-additive method, a subtractive method or the like. A solder resist layer may be formed to expose a part of the electrode pads 22. A solder resist layer may be formed to expose a part of the electrode pads 23.

The connecting terminal group 30A is formed by the plural connecting terminals 30 arranged under a predetermined rule. The connecting terminal group 30B is formed by the plural connecting terminals 30 arranged under a predetermined rule. The connecting terminals in the connecting terminal groups 30A and 30B are conductive members having properties of springs. The fixing parts 31 being one ends of the connecting terminals 30 are electrically and mechanically connected to the electrode pads 22 via the joining parts 40. The connecting parts 32 on the other ends of the connecting terminals 30 are in contact with the electrode pads of the object to be connected so as to be separated (so as not to be fixed to). The connecting parts 32 can be electrically connected to the electrode pads or the like.

Referring to FIG. 6, in the plan view of the connecting terminal group 30A and the connecting terminal group 30B, the connecting terminals 30 are arranged so as to be slanted by predetermined angles $\theta_1$ with respect to the arranging direction C of the connecting terminals 30. The predetermined angle $\theta_1$ is, for example, about 25° to about 35°. As described, by slanting the connecting terminals 30 relative to the arranging direction C of the connecting terminals 30, it is possible to arrange a larger number of connecting terminals in a unit area in comparison with a case where the connecting terminals 30 are arranged parallel to the arranging direction C. With this, it becomes possible to connect an object to be connected (e.g., a semiconductor package 60A to be described below) in which electrode pads (e.g., electrode pads 64 to be described later) are arrange with a narrow pitch of about 0.4 mm. A detailed structure of the connecting terminals 30 is described later.

The joining parts 40 are formed on the electrode pads 22 to electrically and mechanically connect the fixing parts 31 of the connecting terminals 30 to the electrode pads 22. The material of the joining parts 40 is a conductive material such as solder and a conductive resin paste such as an Ag paste. When the material of the joining part 40 is solder, the solder may be, for example, an alloy containing Pb, an alloy containing Sn and Cu, an alloy containing Sn and Ag, an alloy containing Sn, Ag, and Cu, and so on.

The flexible substrate 50 includes a substrate body 51 and plural electrode pads 52 and 53. The electrode pads 52 are formed on one surface 51a of the substrate body 51 at one longitudinal end of the substrate body 51. The electrode pads 52 are electrically connected to the electrode pads 23 of the substrates 20 which are laminated on the surface 51a of the flexible substrate 50 at the one longitudinal end via the joining parts. The electrode pads 53 are formed on the surface 51a of the substrate body 51 at the other longitudinal end of the substrate body 51. The electrode pads 53 are electrically connected to the electrode pads 23 of the substrate 20 which are laminated on the surface 51a of the flexible substrate 50 at the other longitudinal end via the joining parts. The material of the joining parts 41 is a conductive material such as solder and a conductive resin paste such as an Ag paste. When the material of the joining part 41 is solder, the solder may be, for example, an alloy containing Pb, an alloy containing Sn and Cu, an alloy containing Sn and Ag, an alloy containing Sn, Ag, and Cu, and so on.

The flexible substrate 50 is bent, folded back or turned down between a region where the electrode pads 52 are formed at one end of the surface 51a and the region where the electrode pads 53 are formed at the other end of the surface 51a. The electrode pads 52 and the electrode pads 53 are arranged so as to overlap in plan view. The electrode pads 52 and 53 overlapping in their plan views are electrically connected by a wiring pattern (not illustrated) formed on the surface 51a of the substrate body 51 and in inner layers of the substrate body 51 (not illustrated).

For example, the substrate body 51 is made of a material such as a polyimide resin and a liquid crystal polymer having higher flexibility than that of the substrate 20. Before folding, the planar shape of the substrate body 51 is, for example, a strip-like shape. For example, the thickness of the substrate body 51 may be about 50 to 200 µm.

The material of the electrode pads 52 and 53 may be copper (Cu). The thicknesses of the electrode pads 52 and the electrode pads 53 are, for example, 5 to 10 µm. The electrode pads 52 and 53 may be formed by various wiring forming methods such as a semi-additive method and a subtractive method. A solder resist layer may be formed to expose a part of the electrode pads 52 and 53.

As described, the connecting terminals 30 in the connecting terminal group 30A are electrically connected to one of the substrates 20, the flexible substrate 50, the other substrate 20 and the connecting terminals 30 in the connecting terminal group 30B. Here, the connecting terminals 30 in the connecting terminal group 30B correspond to the connecting terminals 30 in the connecting terminal group 30A substantially overlapping the connecting terminals 30 in their plan views.

The supporting body 55 is substantially shaped like a letter U and has a substantially constant height. The supporting body 55 is arranged between the substrate 20 and the other substrate 20. The supporting body 55 supports the substrate 20 and the other substrate 20 while the substrate 20 and the other substrate 20 are outwardly protruded and the flexible substrate 50 is bent, folded back or turned down so that the one end faces the other end. The supporting body further determines the intervals (the heights) between the connecting terminals 30 in the connecting terminal group 30A and the connecting terminals 30 in the connecting terminal group 30B. The upper end surface 55a of the supporting body 55 is connected to a lower outer peripheral edge of the substrate 20 via, for example, an adhesive agent (not illustrated). The lower end surface 55b of the supporting body 55 is connected to an upper outer peripheral edge of the other substrate 20 via, for example, an adhesive agent (not illustrated). For example, the supporting body 55 can be formed by a metallic material such as aluminum (Al) and stainless (SUS), or a resin material containing a main component of an epoxy resin or the like. The supporting body 55, the substrate 20 and the other substrate 20 may be fixed by press fit, screw cramp or the like without using an adhesive agent. For example, the height of the supporting body 55 (the interval between the substrate 20 and the other substrate 20) may be 5 mm or more.

Figure 7:
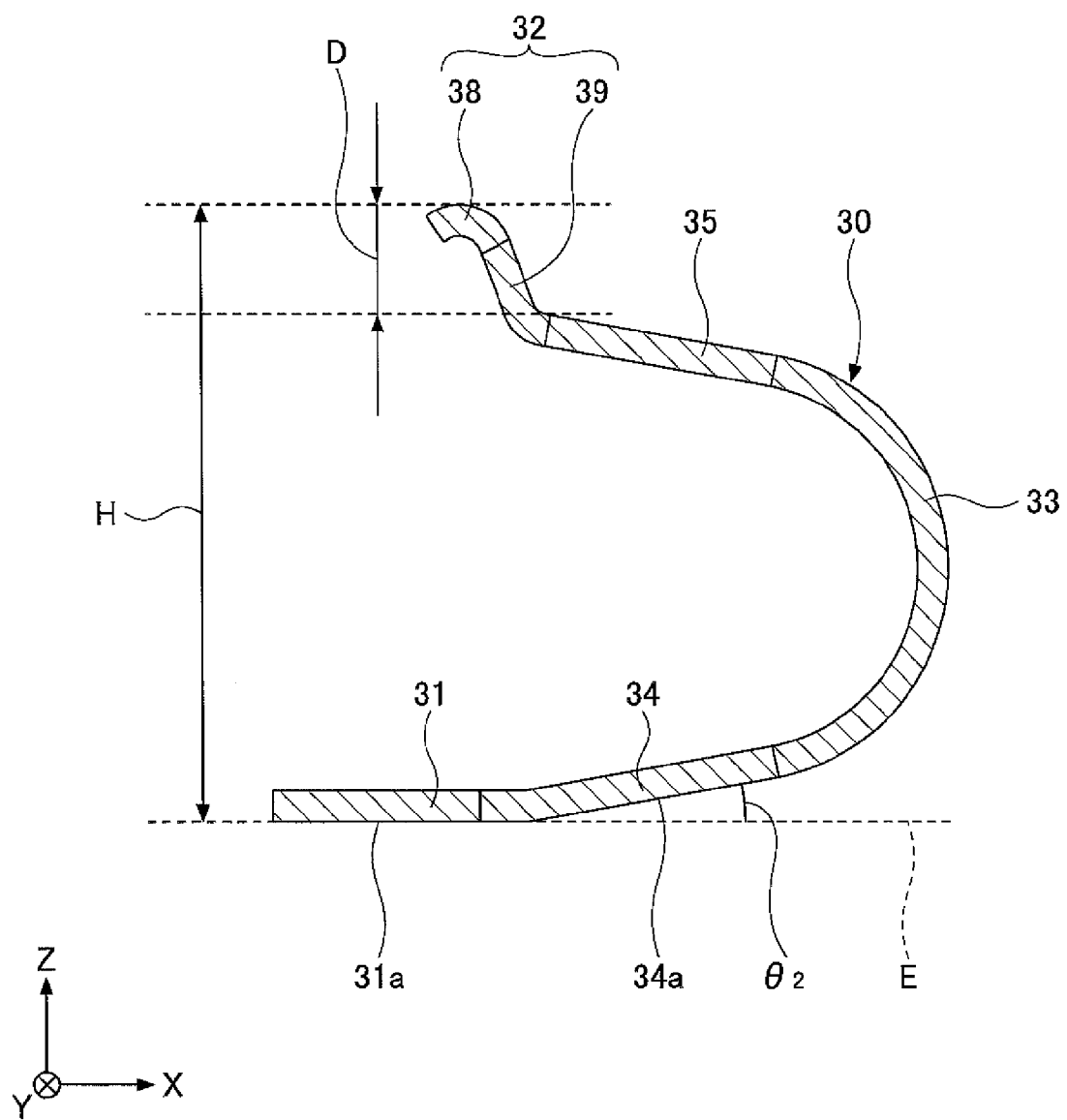
FIG. 7 is a cross-sectional view of the connecting terminal of the first embodiment.

Referring to FIG. 7, a detailed structure of the connecting terminal 30 is described. FIG. 7 is an exemplary cross-sectional view of the connecting terminal of the first embodiment. Referring to FIG. 7, the connecting terminal 30 is a conductive member having a spring property (flexibility). The connecting terminal 30 includes the fixing part 31, a connecting part 32, a spring part 33, a first supporting part 34, and a second supporting part 35.

The fixing part 31 is formed at one end of the connecting terminal 30. The fixing part 31 is shaped like a plate. The thickness of the fixing part 31 in a direction Z may be about 0.08 mm. The width of the fixing part 31 in a direction Y may be about 0.4 mm. The length of the fixing part 31 in a direction X may be about 0.4 mm.

The connecting part 32 is formed at the other end of the connecting terminal 30 so as to face the fixing part 31. The connecting part 32 is electrically connected to the fixing part 31 via the spring part 33, the first supporting part 34 and the second supporting parts 35. The connecting parts 32 include a connecting part 38 and a standing part 39. The thicknesses of the connecting parts 32 may be about 0.08 mm. The width of the connecting parts 32 in the direction Y may be about 0.2 mm. The spring part 33, the first supporting part 34 and second supporting part 35 may be referred to as a curved portion.

The contacting part 38 is in contact with the electrode pad of the object to be connected (for example, the electrode pad 64 of the semiconductor package 60A). The contacting part 38 is rounded and moves mainly in the direction Z when the connecting terminal 30 is pushed with pressure. As described, by rounding the contacting parts 38, it is possible to prevent the electrode pad 64 from being damaged by the contacting part 38 when the contacting part 38 is pushed with pressure so as to be in contact with the electrode pad 64.

The contacting part 38 is in contact with the electrode pad 64 or the like after the connecting part 32 is moved in a direction of approaching the fixing part 31 (the direction Z) with deformation of the spring part 33 when the semiconductor package 60 pushes the connecting part 32. With this, when the electrode pad 64 or the like is in contact with the connecting part 32, the connecting part 32 does not largely move in a direction parallel to the surface of the electrode pad 64 to thereby enable to arrange the electrode pads 64 or the like at a narrow pitch. The pitch of the electrode pad 64 and so on (the pitch of the contacting parts 38) may be about 0.4 to about 1.5 mm.

On end of the standing part 39 is integrally formed with the second supporting part 35. The other end of the standing part 39 is integrally formed with the contacting part 38. The standing part 39 protrudes in a direction from the second supporting part 35 to the electrode pad 64 (a direction of separating from the fixing part 31).

As described, the standing part 39 is provided between the contacting part 38 and the second supporting part 35 so as to be integrally formed with the contacting part 38 and the second supporting part 35. Further, the standing part 39 protrudes in a direction from the second supporting part 35 to the electrode pad 64 in the direction of separating from the fixing part 31 to thereby provide the following effects. Said differently, it becomes possible to prevent the electrode pad 64 or the like from being in contact with the second supporting part 35 due to the deformation of the spring part 33 when the semiconductor package 60A or the like pushes the contacting part 38.

A standing distance D of the connecting part 32 from a border between the second supporting part 35 and the standing part 39 under the state where the electrode pad 64 is not in contact with the connecting parts 32 is, for example, 0.3 mm.

The spring part 33 is arranged between the first supporting part 34 and the second supporting part 35 and integrally formed with the first supporting part 34 and the second supporting part 35. The spring part 33 curves (for example, a C-like shape) and has a spring property (being flexible).

The spring part 33 is provided to make the connecting part 32 be in contact with the semiconductor package 60A or the like without fixing the connecting part 32 to the electrode pad 64 or the like by applying a repelling spring force to the connecting part 32 toward the electrode pad 64 when the connecting part 32 is pushed by the semiconductor package 60A or the like. For example, the width of the spring part 33 in the direction Y and the thickness of the spring part 33 may be the same as the width of the connecting part 32 and the thicknesses of the connecting part 32.

In the connecting terminal 30 of the first embodiment of the present invention, the first supporting part 34, the spring part 33, the second supporting part 35 and the connecting part 32 integrally function as a spring. The spring constant of the connecting terminal 30 corresponding to the first supporting part 34, the spring part 33, the second supporting part 35 and the connecting part 32 is, for example, 0.6 to 0.8 N/mm.

The first supporting part 34 is arranged between the spring part 33 and the fixing part 31. One end of the first supporting part 34 is integrally formed with one end of the spring part 33. The other end of the first supporting part 34 is integrally formed with the fixing part 31. The first supporting part 34 is shaped like a plate.

The first supporting part 34 is formed so that an angle $\theta_2$ formed between a plane E including the first face 31a of the fixing portion 31 and a face 34a of the first supporting part 34 opposite to the board 20 becomes an acute angle. The angle $\theta_2$ is, for example, 5° to 15°.

By making the angle $\theta_2$ an acute angle, it becomes possible to prevent a contact between the substrate 20 and the first supporting part 34 caused by deformation of the spring part 33 from pushing the contacting part 38 with the semiconductor package 60A or the like. Therefore, it is possible to prevent the connecting terminal 30 and the substrate 20 from being damaged. The width of the first supporting part 34 in the direction Y and the thicknesses of the first supporting part 34 may be the same as the width of the connecting part 32 and the thickness of the connecting part 32.

The second supporting part 35 is arranged between the spring part 33 and the connecting part 32. One end of the second supporting part 35 is integrally formed with the other end of the spring part 33. The other end of the second supporting part 35 is integrally formed with the standing part 39 of the connecting part 32. The second supporting part 35 is shaped like a plate. The width of the second supporting part 35 in the direction Y and the thickness of the second supporting part 35 may be the same as the width of the connecting part 32 in the direction Y and the thickness of the connecting part 32.

Referring to FIG. 7, the height H of the connecting terminal 30 under a state where the connecting part 32 of the connecting terminal 30 is not pushed with pressure may be, for example, about 1 mm to about 2 mm.

[Manufacturing Method of Connecting Terminal Structure of the First Embodiment]

Figure 8:
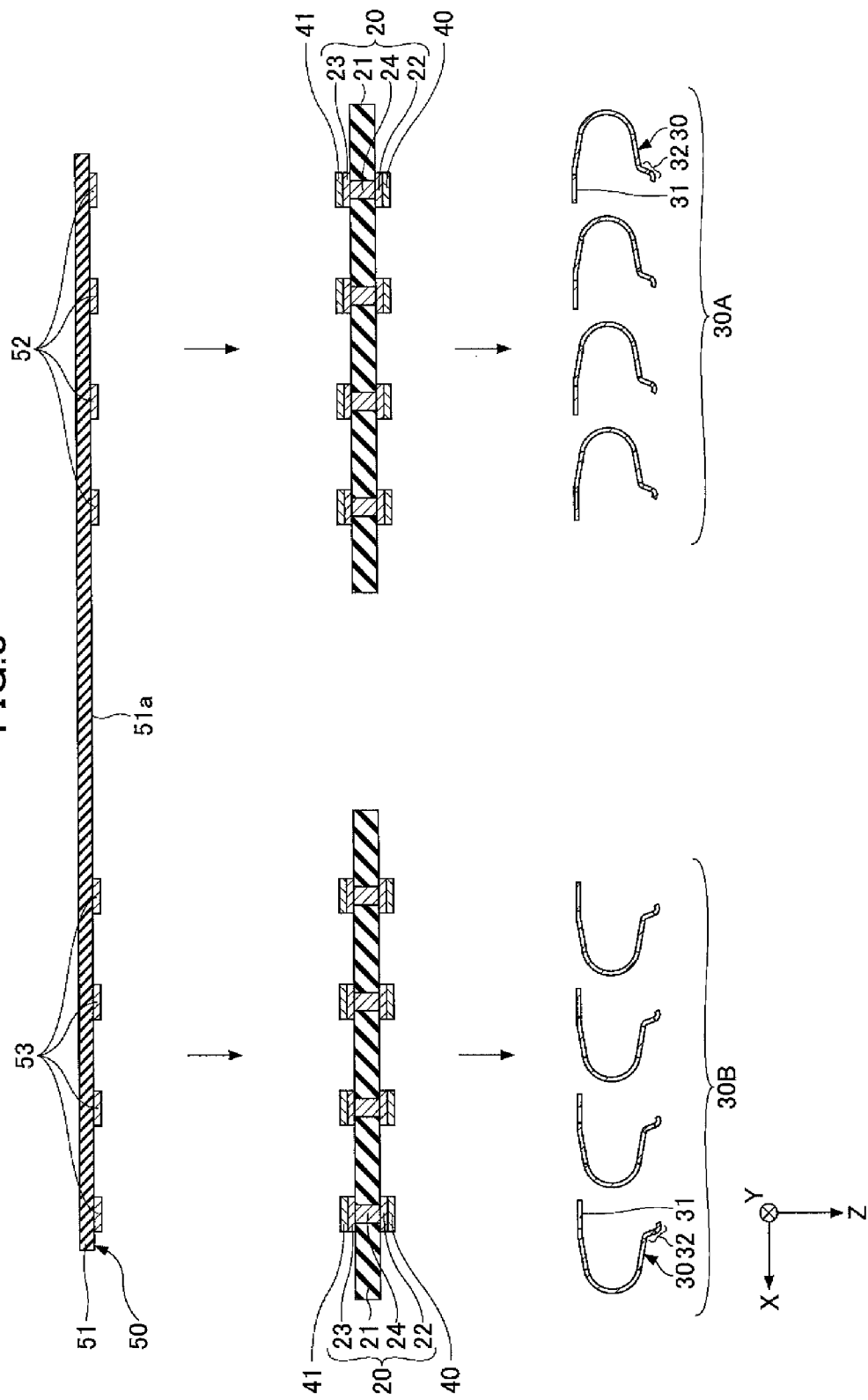
FIG. 8 illustrates a manufacturing method of the connecting terminal structure of the first embodiment.
Figure 9:
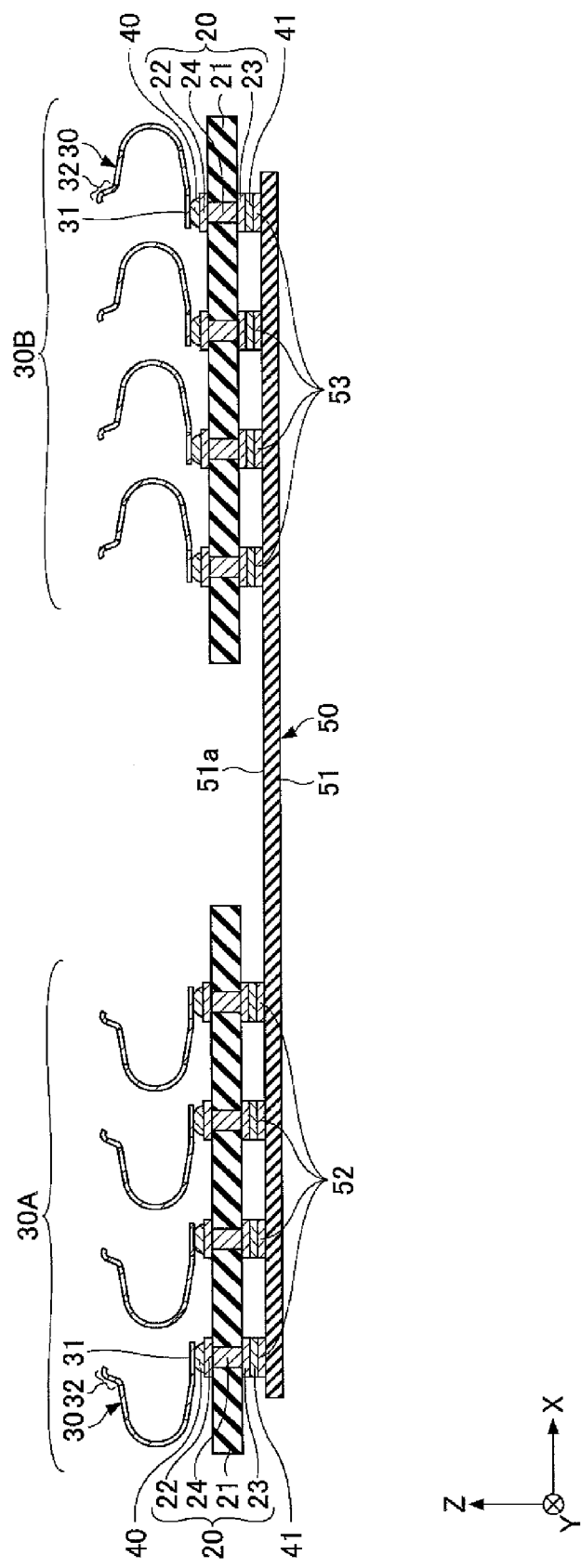
FIG. 9 illustrates the manufacturing method of the connecting terminal structure of the first embodiment.
Figure 10:
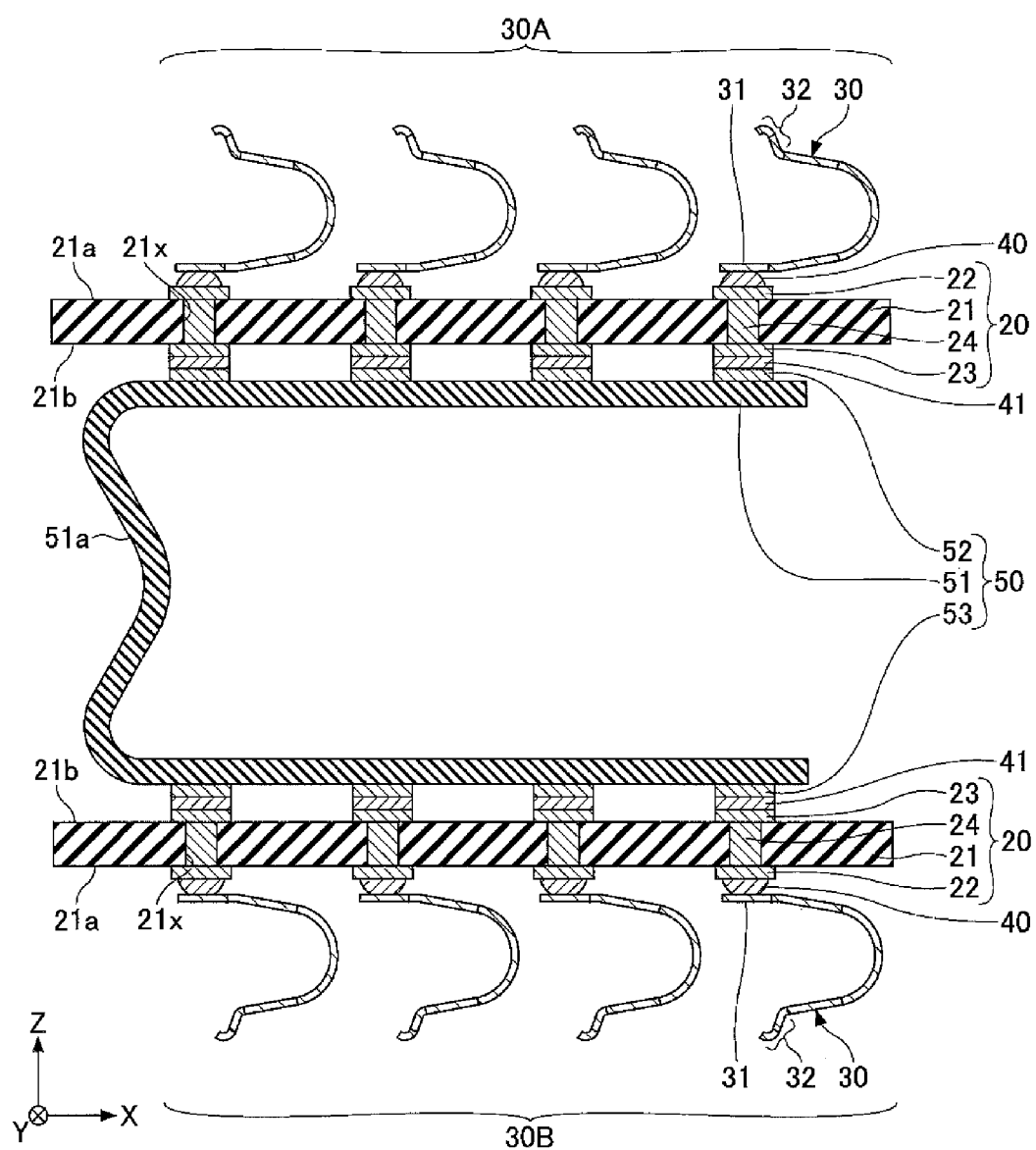
FIG. 10 illustrates the manufacturing method of the connecting terminal structure of the first embodiment.

Referring to FIG. 8 to FIG. 10, a manufacturing method of the connecting terminal structure 10 is described. FIG. 8 to FIG. 10 are cross-sectional views of the connecting terminal structure of the first embodiment. Referring to FIG. 8, the substrate 20 and so on are illustrated upside down in comparison with the substrate 20 of FIG. 5.

Referring to FIG. 8, the connecting terminal 30 as many as 16 in the connecting terminal group 30A and the connecting terminals 30 as many as 16 in the connecting terminal group 30B, two substrates 20 having the joining parts 40 formed on the electrode pads 22, and one flexible substrate 50 are prepared and arranged in a predetermined state.

Specifically, the connecting terminals 30 in the connecting terminal group 30A are provisionally fixed to a predetermined jig (not illustrated) while directing the fixing parts 31 to the upside. Specifically, the connecting terminals 30 in the connecting terminal group 30B are provisionally fixed to a predetermined jig (not illustrated) while directing the fixing parts 31 to the upside. The fixing parts 31 of the connecting terminals 30 in the connecting terminal group 30A are made in contact with the electrode pads of the substrate 20 via the joining parts 40. The fixing parts 31 of the connecting terminals 30 in the connecting terminal group 30B are made in contact with the electrode pads of the other substrate 20 via the joining parts 40. Further, the electrode pads 23 of the substrate 20 are made in contact with the electrode pads 52 of the flexible substrate 50 via the joining parts 41, and the electrode pads 23 of the substrate 20 are made in contact with the electrode pads 53 of the flexible substrate 50 via the joining parts 41.

The substrate 20 and the flexible substrate 50 can be manufactured by a known method. Specifically, the connection terminal 30 may be manufactured as follows. A metallic plate (not illustrated) made of, for example, a Cu alloy such as phosphor bronze, beryllium copper, or a Corson system copper alloy is prepared. The prepared metallic plate is punched out so as to have a predetermined shape. At this time, the metallic plate is punched out to be shaped like a long beam. Thereafter, a film of Ni plating having a thickness of, for example, 1 µm to 3 µm is formed on an entire surface of the punched-out metallic plate. Further, a film of Au plating having a thickness of, for example, 0.3 µm to 0.5 µm is laminated (partly formed) on the film of Ni plating formed at positions corresponding to the fixing part 31 and the contacting part 32. Thereafter, the metallic plate on which the film of Ni plating and the film of Au plating are formed is bent. The connecting terminal 30 may be formed by etching a metallic plate to have a predetermined shape (not illustrated) and bending the etched metallic plate to have a predetermined shape.

The components illustrated in FIG. 8 are mutually assembled in steps illustrated in FIG. 9. Specifically, the components illustrated in FIG. 8 arranged in jigs (not illustrated) are put into a reflow furnace and heated to be 230° C. to melt the joining part 40 and the joining parts 41 made of the solder or the conductive resin paste (e.g., an Ag paste) and subsequently to cure by returning to an ordinary temperature. Thereafter, by removing the predetermined arranging jig (not illustrated), the components are assembled as illustrated in FIG. 9. Referring to FIG. 8 and FIG. 9, the components are illustrated upside down from each other.

Referring to FIG. 10, the flexible substrate 50 illustrated in FIG. 9 is bent, folded back or turned down between a region (one end of the surface 51a) where the electrode pads 52 are formed and a region (the other end of the surface 51a) where the electrode pads 53 are formed. At this time, the flexible substrate 50 is bent, folded back or turned down so that the one end and the other end of the flexible substrate 50 face each other while directing the one substrate 20 and the other substrate 20 outward so that the substrate 20 and the other substrate 20 are substantially in parallel.

Thereafter, the supporting body 55 illustrated in FIG. 4 or the like is prepared, the upper end surface 55a of the supporting body 55 is joined to the lower peripheral portion of the substrate 20 via the adhesive agent (not illustrated), and the lower end surface 55b of the supporting body 55 is joined to the upper peripheral portion of the other substrate 20 via the adhesive agent (not illustrated). With this, the connecting terminal structure 10 illustrated in FIG. 3 to FIG. 6 is completed. Meanwhile, protrusions may be formed on the upper end surface 55a and the lower end surface 55b, respectively, and recesses to be engaged with the protrusions may be formed at end portions of the substrate 20 and the other substrate 20, respectively. With this, the substrate 20, the other substrate 20 and the supporting body 55 can be easily aligned.

In the above-described connecting terminal structure of the first embodiment, the connecting terminals 30 in the connecting terminal group 30A are fixed to the one side of the supporting body 55 via the substrate 20, and the connecting terminals 30 in the connecting terminal group 30B are fixed to the other side of the supporting body 55 via the other substrate 20. The connecting terminals in the connecting terminal group 30A and the connecting terminals in the connecting terminal group 30B are electrically connected via the substrate 20, the other substrate 20 and the flexible substrate 50. As a result, for example, the connecting parts 32 of the connecting terminals 30 in the connecting terminal group 30A contact the electrode pads of the object to be connected, and the connecting parts 32 of the connecting terminals 30 in the connecting terminal group 30B contact the electrode pads of the other object to be connected. Therefore, the object to be connected and the other object to be connected are electrically connected each other via the connecting terminal structure.

Further, by replacing the supporting body 55 with another supporting body having a similar shape to the supporting body 55 and a height different from that of the supporting body 55, the height of the entire connecting terminal structure 10 can be easily changed without changing the design of the structures of the substrate 20 and the connecting terminals 30. With this, it is possible to easily deal with a case where the object to be packaged is connected to the other object to be packaged while maintaining a certain distance between the object to be packaged and the other object to be packaged. If necessary, the length of the flexible substrate 50 may be changed. The length of the flexible substrate 50 can be easily changed. It is preferable that the bending portion of the flexible substrate 50 is loosely bent, folded back or turned down so as to conform to a change in the height of the supporting body 55.

Further, in the exemplary socket illustrated in FIG. 2, the thickness of the substrate 201 is increased in order to make the entire height of the socket greater. However, in the connecting terminal structure 10, since the entire height of the socket can be increased by changing only the height of the supporting body 55, the thickness of the substrate 20 is not increased. Therefore, heat capacity in joining the connection terminals 30 to the substrate 20 by solder or the like can be reduced to thereby facilitate a manufacturing process of the connection terminal structure 10.

Further, since the thickness of the substrate 20 is not increased, it is possible to reduce a ratio of the through wirings 24 occupying a wiring route inside the connecting terminal structure 10 and replace the through wirings 24 with the wiring pattern of the flexible substrate 50. As a result, the wiring pattern of the flexible substrate 50 may have a transmission line structure such as a microstripline to thereby improve transmission characteristics.

Modified Example 1 of First Embodiment

In the modified example 1 of the first embodiment, a reinforcing board is provided on a back side of a flexible substrate. In the modified example 1 of the first embodiment, explanation of components the same as those described in the above description of the first embodiment is omitted.

Figure 11:
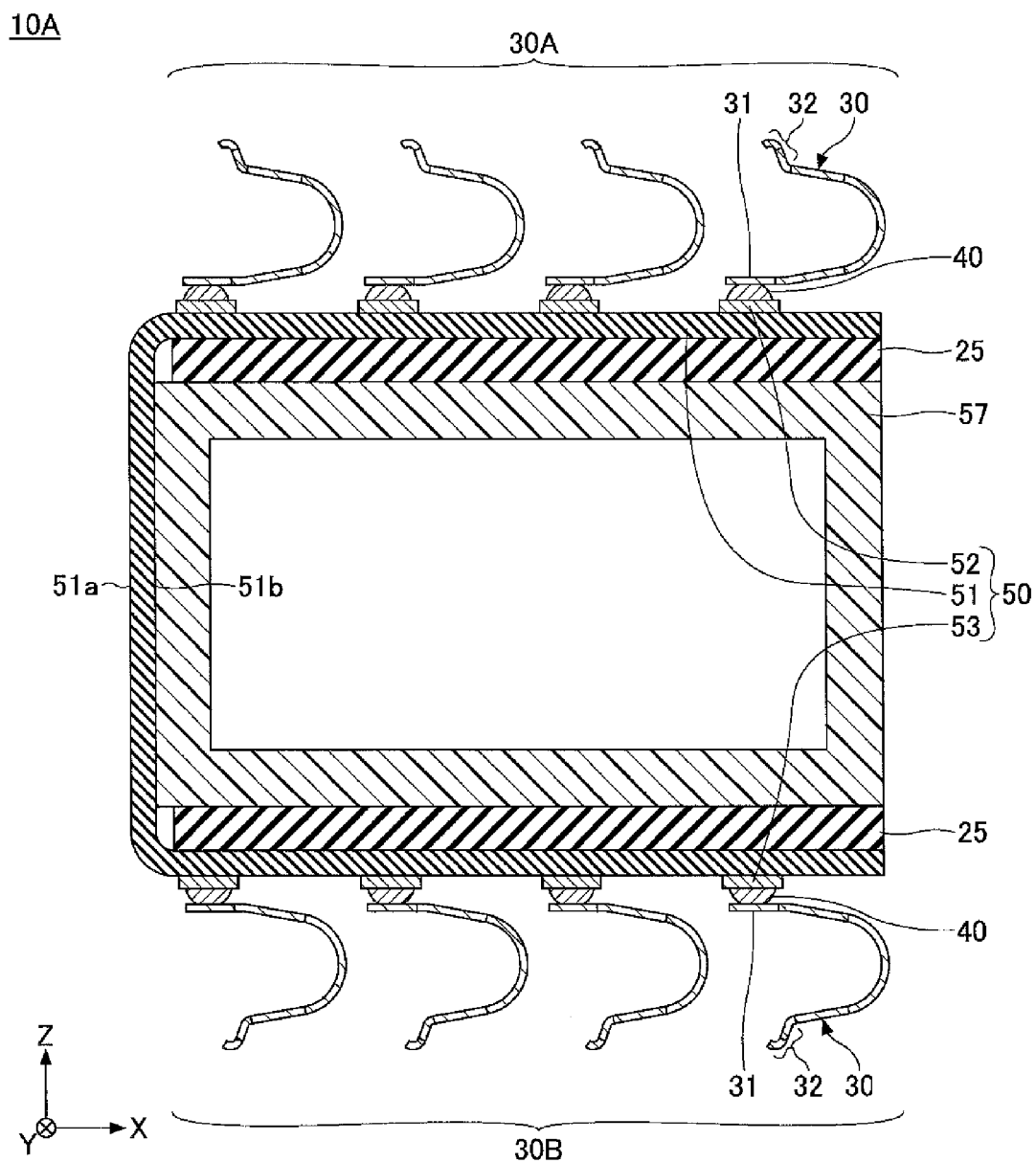
FIG. 11 is a cross-sectional view of the connecting terminal structure of a modified example 1 of the first embodiment.

FIG. 11 is a cross-sectional view of a connection terminal structure of the modified example 1 of the first embodiment.

Referring to FIG. 11, the connecting terminal structure 10A of the modified example 1 of the first embodiment does not include a substrate. Instead, a reinforcing board 25 is provided, and the supporting body 55 is replaced by a supporting body 57 in comparison with the connecting terminal structure 10 (see FIG. 3 to FIG. 6).

In the connecting terminal structure 10A, the reinforcing board 25 is a planar member formed of, for example, an insulating resin. On the reinforcing board 25, an electrically conductive portion such as an electrode pad and a through wiring is not formed. The thickness of the reinforcing board 25 is, for example, about several mm. For example, the supporting body 57 is a box-like member formed of a metallic material such as aluminum (Al) and stainless (SUS), or a resin material containing a main component of an epoxy resin or the like. The supporting body 57 may be hollow or may not be hollow (hollow in FIG. 11).

Connecting terminals 30 in a connecting terminal group 30A are electrically connected to electrode pads 52 formed on one end of a surface 51a of a substrate body 51 of a flexible substrate 50. Connecting terminals 30 in a connecting terminal group 30B are electrically connected to electrode pads 53 formed on the other end of the surface 51a of the substrate body 51 of the flexible substrate 50. For example, the electrode pads 52 and 53 are arranged a periphery-like shape (along a periphery of the flexible substrate 50) or in an area array-like shape (on an entire surface) in response to positions of the connecting terminals 30.

The one end of the other surface 51b of the substrate body 51 of the flexible substrate 50 is joined to the upper surface of the supporting board 57 via the reinforcing board 25. The other end of the other surface 51b of the substrate body 51 of the flexible substrate 50 is joined to the lower surface of the supporting body 57 via the other reinforcing board 25. Said differently, the supporting body 57 supports the reinforcing board 25 and the other reinforcing body 25 in a state where the flexible substrate 50 is bent, folded back or turned down so that the surface 51a is directed outwardly and the reinforcing board 25 faces the other reinforcing board 25. The flexible substrate 50, the reinforcing boards 25 and the supporting body 57 may be joined by an adhesive agent (not illustrated). The flexible substrate 50, the reinforcing boards 25 and the supporting body 57 may be fixed to each other by press fitting, screw cramping or the like without using the adhesive agent.

A region connecting a region of the electrode pads 52 of the flexible substrate 50 to a region of the electrode pads 53 of the flexible substrate 50 is joined to an outer side surface of the supporting body 57 via an adhesive agent (not illustrated). The substrate body 51 of the flexible substrate 50 is made of a material having a higher flexibility than that of the reinforcing boards 25 such as a liquid-crystal polymer and a polyimide resin.

When the connecting terminals 30 are joined to the flexible substrate 50, the reinforcing boards 25 are previously joined to the one end and the other end of the other surface 51b of the substrate body 51 of the flexible substrate 50.

With the modified example 1 of the first embodiment, effects similar to those in the first embodiment are obtainable. Further, the following effects are obtainable. Said differently, by using the reinforcing boards 25 having no electric conductive portion such as the electrode pad and the through wirings instead of the substrate 20 of the first embodiment, material cost and processing cost can be reduced to thereby lower the cost of the connecting terminal structure 10A compared to that of the connecting terminal structure 10.

The supporting body 55 may be used in the modified example 1 of the first embodiment in a similar manner to the first embodiment.

Modified Example 2 of First Embodiment

Within the modified example 2 of the first embodiment, a connecting terminal group is provided only on one side of a connecting terminal structure 10B. In the modified example 2 of the first embodiment, explanation of components the same as those described in the above description of the first embodiment is omitted.

Figure 12:
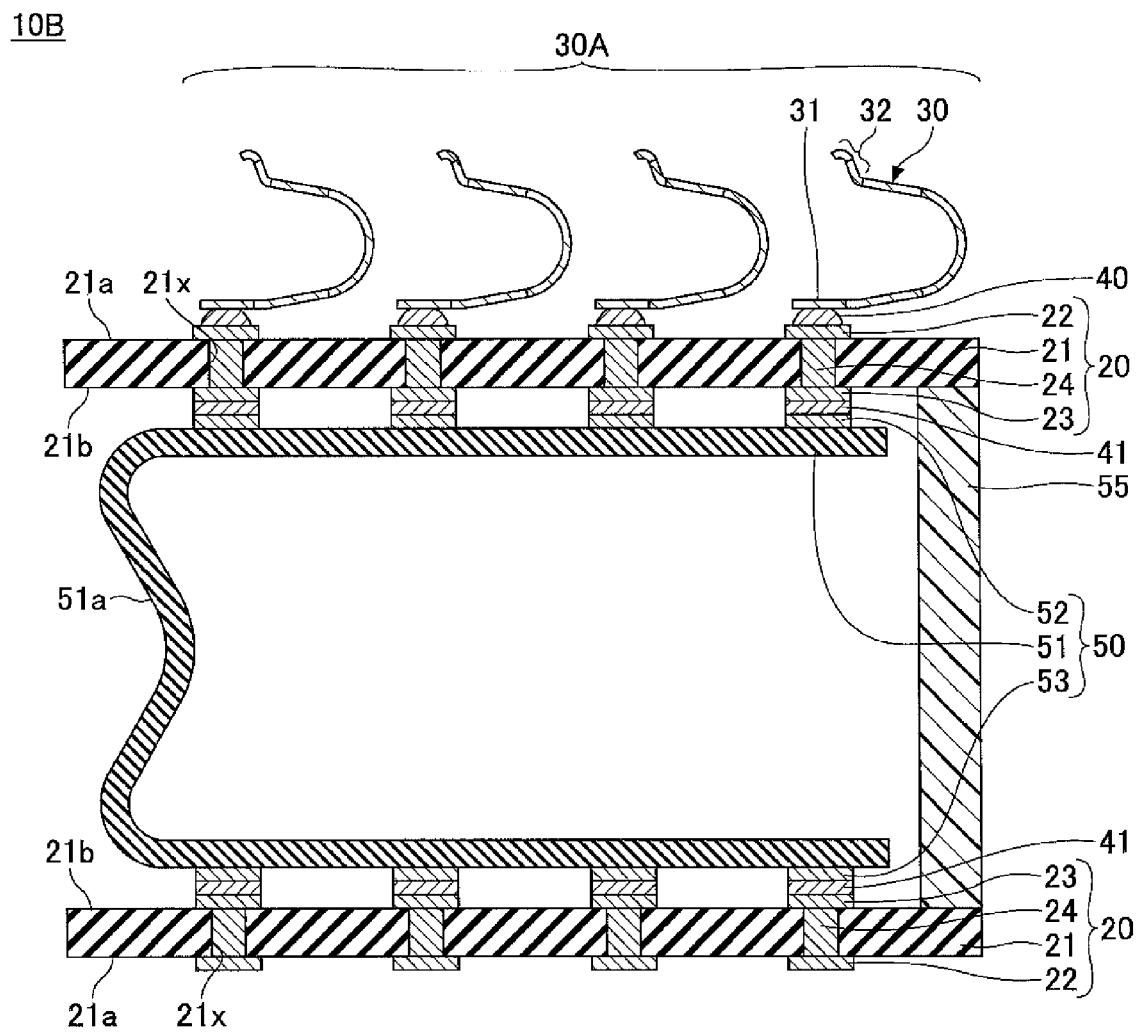
FIG. 12 is a cross-sectional view of a connecting terminal structure of a modified example 2 of the first embodiment.

FIG. 12 is a cross-sectional view of a connecting terminal structure of the modified example 2 of the first embodiment. Referring to FIG. 12, the connecting terminal structure 10B of the modified example 2 of the first embodiment does not include the connecting terminal group 30B and the joining parts 40 for connecting the other substrate 20 with the connecting terminal group 30B, which are included in the connecting terminal structure 10 (see FIG. 3 to FIG. 6). Said differently, in the connecting terminal structure 10B, the connecting terminal group 30A is provided in the substrate 20 which is supported on the one side of the supporting body 55. However, the connecting terminal group is not provided in the other substrate 20 which is supported on the other side of the supporting body 55. On the other side of the supporting body 55, the electrode pads 22 of the other substrate 20 are exposed.

By using the connecting terminal structure 10B, the electrode pads 22 of the other substrate 20 are joined to the electrode pads of the object to be connected by solder or the like, the connecting parts 32 of the connecting terminals 30 in the connecting terminal group 30A are made to be in contact with electrode pads of another object to be connected, and the other object to be connected is pressed toward the object to be connected. Therefore, the other object to be connected is connected to the object to be connected. Joining parts made of solder or the like may be previously formed on the electrode pads 22 of the other substrate 20.

With the modified example 2 of the first embodiment, effects similar to those in the first embodiment are obtainable. Further, the following effects are obtainable. Said differently, by providing only on one side of the supporting body 55, the number of the connecting terminals 30 can be reduced. Therefore, material cost and processing cost for the connecting terminals 30 can be reduced to thereby lower the price of the connecting terminal structure 10B to be less than that of the connecting terminal structure 10. If the object to be connected can be connected so as not to be detachable, a structure such as the connecting terminal structure 10B can be employed.

Modified Example 3 of First Embodiment

Within the modified example 3 of the first embodiment, an example of the connecting terminal structure having a shape in the plan view different from that in the first embodiment is described. In the modified example 3 of the first embodiment, explanation of components the same as those described in the above description of the first embodiment is omitted.

Figure 13:
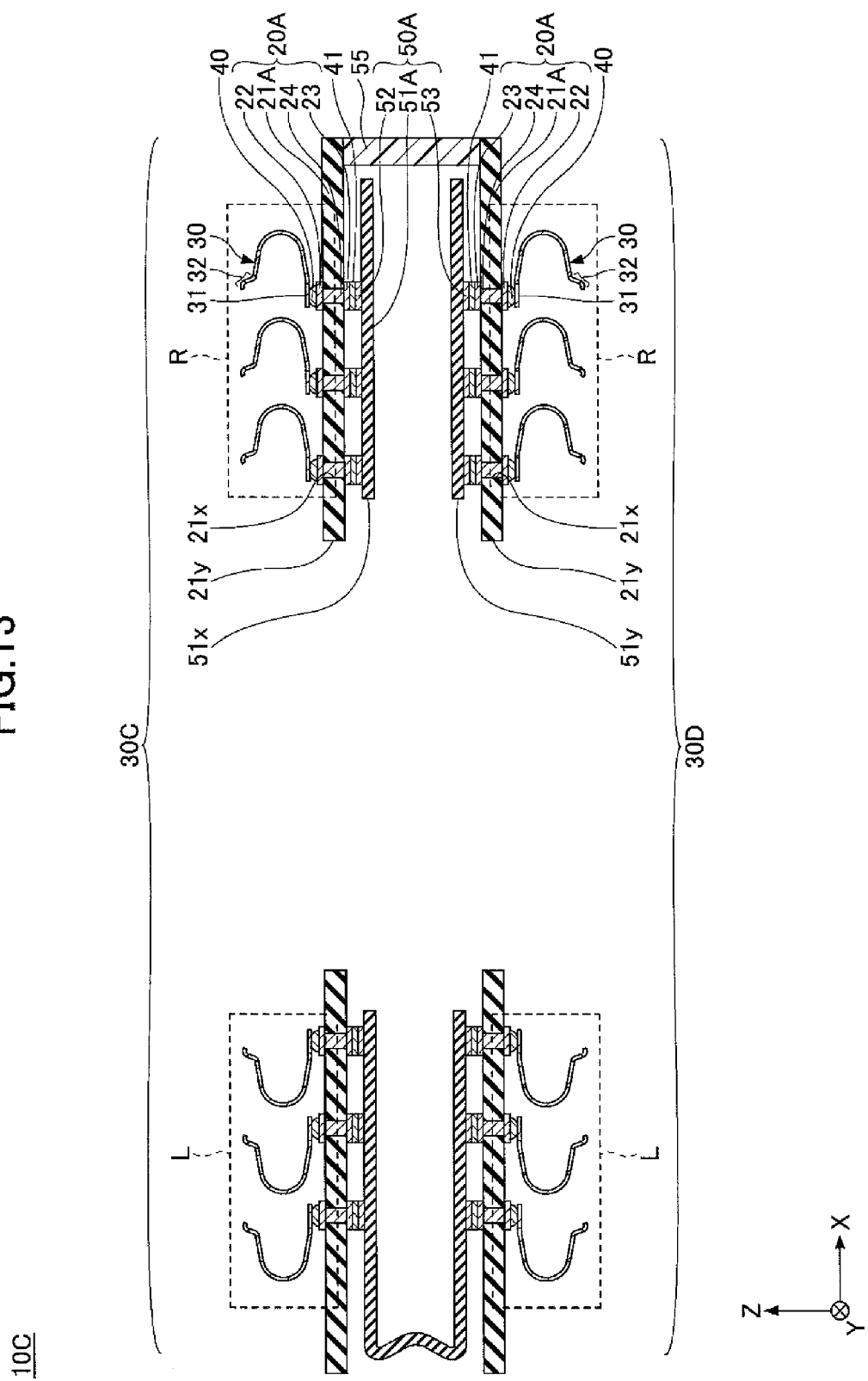
FIG. 13 is a cross-sectional view of a connecting terminal structure of a modified example 3 of the first embodiment.
Figure 14:
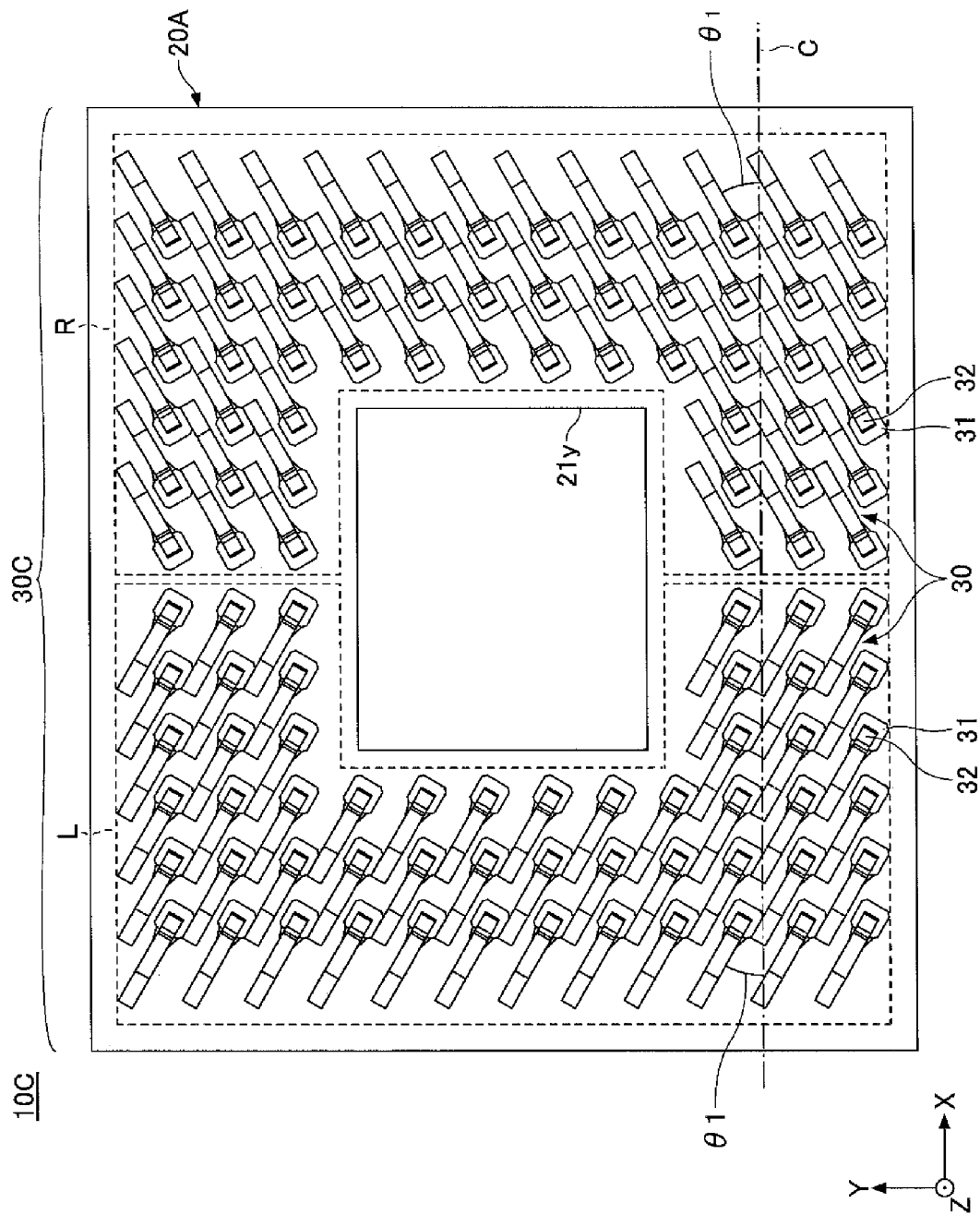
FIG. 14 is a plan view of the connecting terminal structure of the modified example 3 of the first embodiment.

FIG. 13 is a cross-sectional view of a connecting terminal structure of the modified example 3 of the first embodiment. FIG. 14 is a cross-sectional view of the connecting terminal structure of the modified example 3 of the first embodiment. Referring to FIG. 13 and FIG. 14, a connecting terminal structure 10C of the modified example 3 of the first embodiment is formed in comparison with the connecting terminal structure of the first embodiment (see FIG. 3 to FIG. 6) by replacing the substrate 20 with a substrate 20A, the connecting terminal group 30A with a connecting terminal group 30C, the connecting terminal group 30B with a connecting terminal group 30D, and the flexible substrate 50 with a flexible substrate 50A.

In the connecting terminal structure 10C, the substrates 20A include substrate bodies 21A having opening parts 21y at around centers of the substrates 20A. Around the periphery of the opening part 21y of the substrate body 21A, electrode pads 22, through wirings 24 and electrode pads 23 are arranged. For example, the electrode pads 22 and 23 are arranged in a periphery-like shape along a periphery of the substrate 20A in response to positions of the connecting terminals 30.

Referring to FIG. 13, in the connecting terminal group 30C, the connecting terminals 30 arranged on a region L of the substrate 20A face the connecting terminals 30 arranged on a region R of the substrate 20A. Referring to FIG. 13, in a connecting terminal group 30D, the connecting terminals 30 arranged on a region L of the substrate 20A face the connecting terminals 30 arranged on a region R of the substrate 20A. With the arrangement, when the connecting terminals 30 are pushed in a direction Z, a counter force generated in lateral directions (directions other than the direction Z) can be relaxed. Especially, this structure is advantageous when the number of the connecting terminals 30 is great. However, if the number of the connecting terminals 30 is relatively small enough to ignore the counter force generated in the lateral directions (directions other than the direction Z), it may be possible to arrange the connection terminals 30 in the region L and the connection terminals 30 in the region R in the same direction.

In the plan view, the connecting terminals 30 slant by an angle $\theta_1$ relative to an arranging direction C of the connecting terminals. However, within the modified example 3 of the first embodiment, the connecting terminals 30 in the region L and the connecting terminals 30 in the region R substantially face one another. Therefore, the connecting terminals 30 in the region L and the connecting terminals 30 in the region R slant in different directions. The predetermined angle $\theta_1$ is, for example, about 25° to about 35°.

Referring to FIG. 14, the connecting terminals 30 in the region L and the connecting terminals 30 in the region R are arranged in symmetry with respect to a line perpendicular to the arranging direction C. However, the connecting terminals 30 in the region R and the connecting terminals 30 in the region L may be differently arranged. For example, the arrangement of the connecting terminals 30 in the region L may be changed such that the connecting terminals 30 illustrated in FIG. 14 are arranged in symmetry with respect to an axis parallel to the arranging direction C. Said differently, the connecting terminals 30 in the region L and the connecting terminals 30 in the region R may slant in the same direction.

The flexible substrate 50A includes a substrate body 51A having an opening part 51x in the vicinity of a center part on one end side and an opening part 51y in the vicinity of a center part on another end side. The opening parts 51x and 51y of the substrate body 51A and the opening parts 21y of the substrate bodies 21A substantially overlap in their plan views. Said differently, the connecting terminal structure 10C includes the opening part penetrating through the substrates 20A and the flexible substrate body 51A from the side of the electrode pads 22 of the one of the substrates 20A to the electrode pads 22 on the other substrate 20A. The opening parts 51x and 51y may be greater than the opening part 21y.

In the periphery of the opening part 51x, the electrode pads 52 corresponding to the electrode pads 23 to which the connecting terminals 30 in the connecting terminal group 30C are connected are arranged. In the periphery of the opening part 51y, the electrode pads 53 corresponding to the electrode pads 23 to which the connecting terminals 30 in the connecting terminal group 30D are connected are arranged.

With the modified example 3 of the first embodiment, effects similar to those in the first embodiment are obtainable. Further, the following effects are obtainable. Said differently, by forming the opening parts in the substrates 20A and the flexible substrate 50A, it is possible to provide a space for a tall component (escaping the tall component) mounted on one or both of the object to be connected and the other object to be connected at a time of electrically connecting the object to be connected to the other object to be connected.

[b] Second Embodiment

Within the second embodiment, there is described an example of performing an electric check for a semiconductor package using the connecting terminal structure 10C of the modified example 3 of the first embodiment. In the second embodiment, explanation of components the same as those described in the above description of the first embodiment is omitted.

Figure 15:
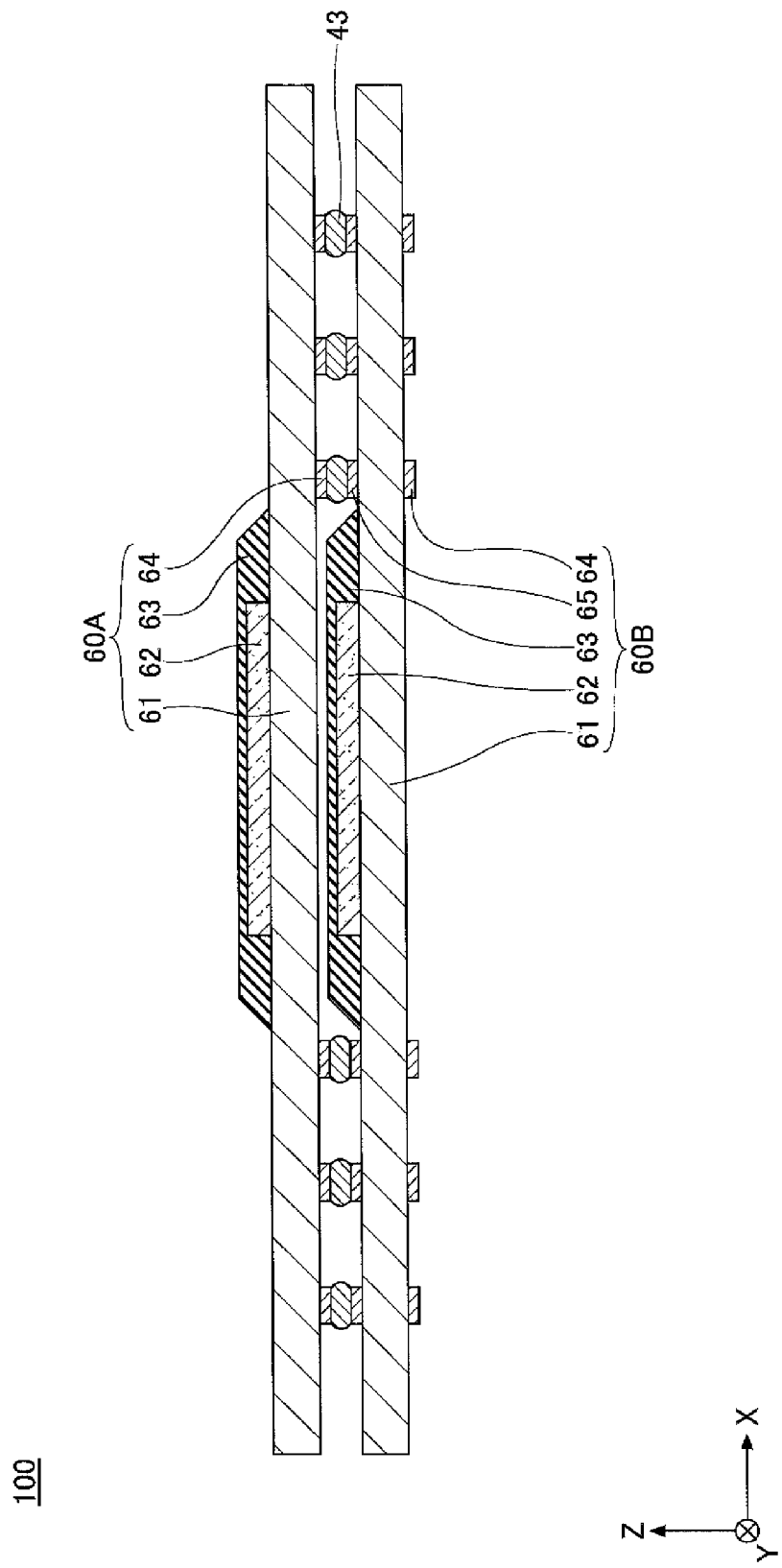
FIG. 15 is a cross-sectional view of a semiconductor package to be checked of a second embodiment.

FIG. 15 is a cross-sectional view of a semiconductor package to be checked. Referring to FIG. 15, the semiconductor package 100 has a package on package (POP) structure where semiconductor packages 60A is mounted via joining parts 43 on the semiconductor package 60B.

The semiconductor package 60A is a Land Grid Array (LGA) including a substrate 61, a semiconductor chip 62, a encapsulation resin 63 and electrode pads 64. The substrate 61 is formed by laminating a substrate body containing an insulating resin, an insulating layer, wiring patterns, through wirings (not illustrated) and so on. The semiconductor chip 62 containing silicon and so on is mounted on one side of the substrate 61, and the electrode pads 64 being a part of the wiring pattern are formed on the other surface of the substrate 61. The semiconductor chip 62 and the electrode pads 64 are electrically connected via the through wiring (not illustrated) formed on the substrate 61.

The material of the electrode pads 64 is, for example, copper (Cu). The thicknesses of the electrode pads 64 are, for example, about 5 to 10 μm. The semiconductor chip 62 may be mounted on the substrate 61 and sealed by the encapsulation resin 63 made of an insulating resin. The encapsulation resin 63 may be provided to expose a back face of the semiconductor chip 62 and a radiator plate made of copper (Cu) may be positioned on the back surface of the semiconductor chip 62.

The electrode pads 64 are arranged on a region other than the central part of the other surface of the substrate 61 in a periphery-like shape along a periphery of the substrate 61. In order to improve connection reliability, a rare metal layer may be laminated on an upper surface of the electrode pads 64 by an electroless plating method or the like. For example, the rare metal layer may contain a noble metal such as gold (Au) and palladium (Pd). As an under layer of the gold (Au) layer, a nickel (Ni) layer, a Ni/Pd layer (a metallic layer formed by laminating a Ni layer and a Pd layer in this order) or the like may be provided.

The semiconductor package 60B is a Land Grid Array (LGA) including a substrate 61, a semiconductor chip 62, a encapsulation resin 63, electrode pads 64 and electrode pads 65. The substrate 61, the semiconductor chip 62, the encapsulation resin 63 and the electrode pads 64 are similar to those in the semiconductor package 60A. Therefore, the explanation is omitted. The electrode pads 65 are formed in a peripheral region of the semiconductor chip 62 on the surface of the substrate 61. The positions of the electrode pads 65 correspond to the position where the electrode pads 64 of the semiconductor package 60A are formed.

The electrode pads 65 are electrically connected to the semiconductor element 62. The electrode pads 65 are electrically connected via the electrode pads 64 on the other surface and the through wiring (not illustrated). The material and so on of the electrode pads 65 are similar to those of the electrode pads 64. In a similar manner to the semiconductor package 60A, the rare metal layer may be laminated on the upper surface of the electrode pads 65.

The electrode pads 65 in the semiconductor package 60B are electrically connected to the electrode pads 64 of the semiconductor package 60A via the joining parts 43. The material of the joining parts 43 may be similar to that of the joining parts 40. The semiconductor chip 62 of the semiconductor package 60B may have the same function as or a different function from the semiconductor chip 62 of the semiconductor package 60A.

When the electric check of the semiconductor package 100 is performed, the semiconductor package 100 may be completely assembled. However, if a failure is found in the semiconductor package 60A or the semiconductor package 60B, the semiconductor package 100 is in need of repair. In order to avoid this problem, it is preferable to electrically check the semiconductor packages 60A and 60B by a connecting terminal structure 10C before joining the semiconductor package 60A to the semiconductor package 60B. Hereinafter, an exemplary connection of the semiconductor packages 60A and 60B to the connecting terminal structure 10C is described.

Figure 16:
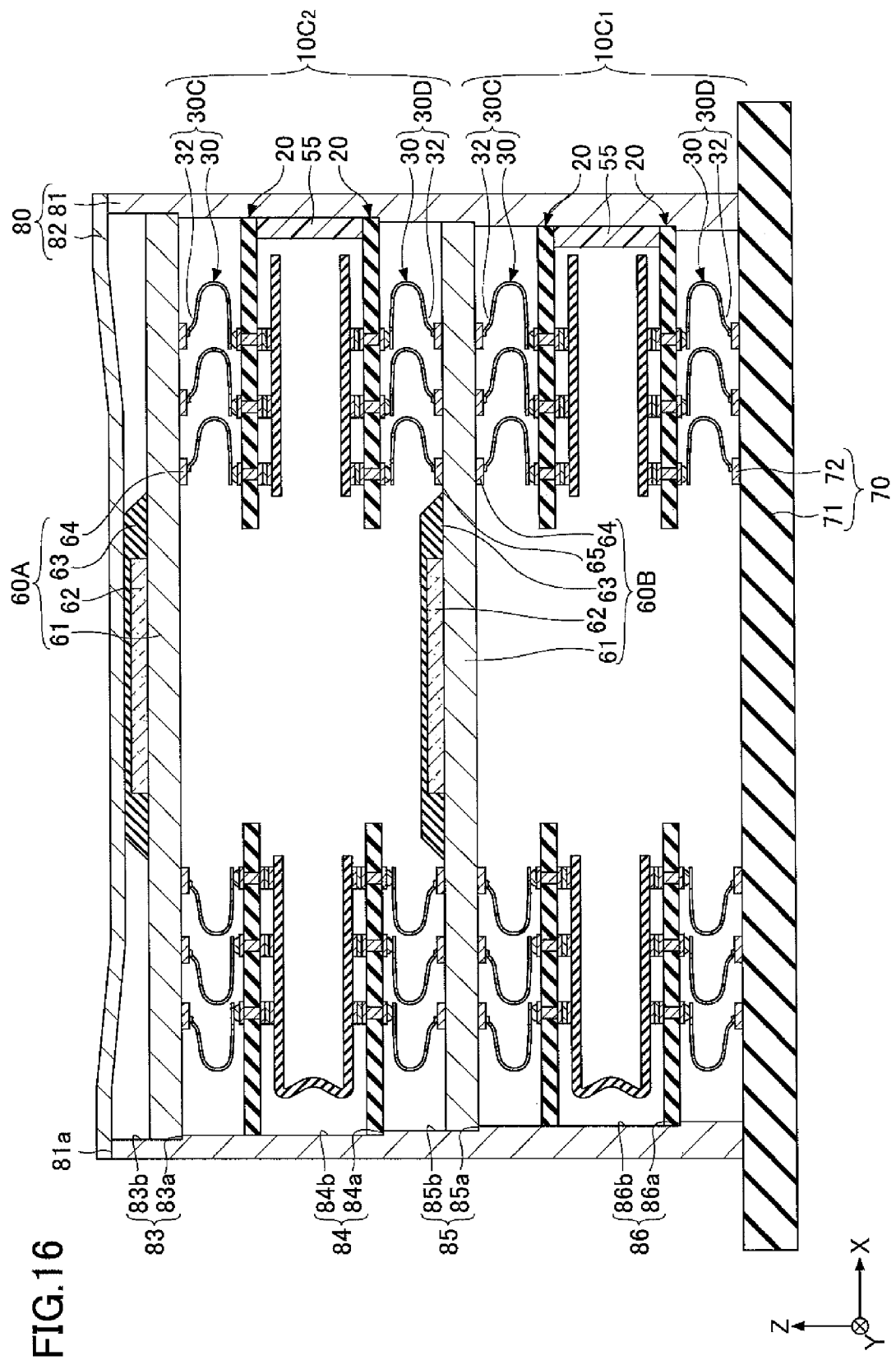
FIG. 16 is a cross-sectional view of exemplary connection of the semiconductor package for electrically checking the semiconductor package.

FIG. 16 is a cross-sectional view of an exemplary connection of the semiconductor package for electrically checking the semiconductor package. Referring to FIG. 16, a first connecting terminal structure 10C (for convenience, hereinafter referred to as a connecting terminal structure $10C_1$), the semiconductor package 60B, a second connecting terminal structure 10C (for convenience, hereinafter referred to as a connecting terminal structure $10C_2$), and the semiconductor package 60A are sequentially laminated and accommodated in a casing 80. The connecting terminal structure $10C_1$, the connecting terminal structure $10C_2$ and the casing 80 are typical example of a socket of the second embodiment.

A checking board 70 has electrode pads 72 and so on being a part of a wiring pattern on a substrate body 71 and is electrically connected to a semiconductor checking system (not illustrated). The checking board 70 can input and output an electric signal for checking between the semiconductor checking system (not illustrated) and the semiconductor package 60A, 60B.

The casing 80 includes a frame 81 and a lid 82. The frame 81 is shaped like an architrave having a substantially rectangular opening in a center of the frame 81 and has aligning and retaining parts 83 to 86. The frame 81 is made of a metal, a resin or the like having rigidity. The frame 81 is fixed to the upper surface of the checking board 70 by a bolt penetrating through the checking board 70 or an adhesive agent (not illustrated).

The frame 81 has functions of positioning and holding the connecting terminal structure $10C_1$, the semiconductor package 60B, the connecting terminal structure $10C_2$ and the semiconductor package 60A thereby mutually aligning these members. The frame 81 has functions of preventing intervals among the connecting terminal structure $10C_1$, the semiconductor package 60B, the connecting terminal structure $10C_2$ and the semiconductor package 60A from being a predetermined value or less.

The aligning and retaining part 83 includes a face 83a and a face 83b. The face 83a is shaped like an architrave. The face 83a is positioned inside the upper face 81a of the frame 81, one step inner than the upper face 81a, and substantially parallel to the upper face 81a. The face 83b is provided perpendicular to the face 81a and between the face 83a and the upper face 81a. The face 83b constitutes a part of the inner side surface of the frame 81.

The face 83a is in contact with the outer edge of the lower surface of the substrate 61 of the semiconductor package 60A. The shape of the opening part formed by the face 83b is rectangular in conformity with the plan view of the semiconductor package 60A. Further, the shape of the opening part formed by the face 83b is slightly greater than the outer shape of the substrate 61 to enable attaching and detaching the semiconductor package 60A. The face 83b and the side surfaces of the substrate 61 may contact or there may be a gap to an extent of not causing a positional shift between the connecting parts 32 being the other ends of the connecting terminals 30 on the connecting terminal group 30C in the connecting terminal structure $10C_2$ and the electrode pads 64 of the semiconductor package 60A.

Since the semiconductor package 60A is held by the aligning and retaining part 83, the semiconductor package 60A is not pressed on a side of the connecting terminal structure $10C_2$ from the face 83a of the aligning and retaining part 83. As a result, it is possible to prevent the semiconductor package 60A from being excessively pressed on the side of the connecting terminal structure $10C_2$ so as not to be deformed, whereby it is possible to prevent destruction of the connecting terminals 30.

An aligning and retaining part 84 includes a face 84a and a face 84b. The face 84a is shaped like an architrave. The face 84a is positioned inside the face 83a, one step inner than the face 83a, and substantially parallel to the upper face 81a. The face 84b is provided perpendicular to the face 84a and between the face 84a and the face 83a. The face 84b constitutes a part of the inner side surface of the frame 81.

The face 84a is in contact with the outer edge of the lower surface of the substrate 20 of the connecting terminal structure $10C_2$. The shape of the opening part formed by the face 84b is rectangular in conformity with the plan view of the connecting terminal structure $10C_2$. Further, the shape of the opening part formed by the face 84b is slightly greater than the outer shape of the substrate 20 and the supporting body 55 to enable attaching and detaching the connecting terminal structure $10C_2$. The face 84b and the side surfaces of the substrate 20 and the supporting body 55 may contact or there may be a gap to an extent of not causing a positional shift between the connecting parts 32 being the other ends of the connecting terminals 30 on the connecting terminal group 30D in the connecting terminal structure $10C_2$ and the electrode pads 65 of the semiconductor package 60B.

Since the connecting terminal structure $10C_2$ is held by the aligning and retaining part 84, the connecting terminal structure $10C_2$ is not pressed on a side of the semiconductor package 60B from the face 84a of the aligning and retaining part 84. As a result, it is possible to prevent the connecting terminal structure $10C_2$ from being excessively pressed on the side of the semiconductor package 60B so as to be deformed, whereby it is possible to prevent destruction of the connecting terminals 30.

An aligning and retaining part 85 includes a face 85a and a face 85b. The face 85a is shaped like an architrave. The face 85a is positioned inside the face 84a, one step inner than the face 84a, and substantially parallel to the upper face 81a. The face 85b is provided perpendicular to the face 85a and between the face 85a and the face 84a. The face 85b constitutes a part of the inner side surface of the frame 81.

The face 85a is in contact with the outer edge of the lower surface of the substrate 61 of the semiconductor package 60B. The shape of the opening part formed by the face 85b is rectangular in conformity with the plan view of the semiconductor package 60B. Further, the shape of the opening part formed by the face 85b is slightly greater than the outer shape of the substrate 61 to enable attaching and detaching the semiconductor package 60B. The face 85b and the side surfaces of the substrate 61 may contact or there may be a gap to an extent of not causing a positional shift between the connecting parts 32 being the other ends of the connecting terminals 30 on the connecting terminal group 30D in the connecting terminal structure $10C_2$ and the electrode pads 65 of the semiconductor package 60, and of not causing a positional shift between the connecting parts 32 being the other ends of the connecting terminals 30 on the connecting terminal group 30C in the connecting terminal structure $10C_1$ and the electrode pads 64 of the semiconductor package 60B.

Since the semiconductor package 60B is held by the aligning and retaining part 85, the semiconductor package 60B is not pressed on a side of the connecting terminal structure $10C_1$ from the face 85a of the aligning and retaining part 85. As a result, it is possible to prevent the connecting terminal structure $10C_1$ from being excessively pressed on the side of the checking board 70 so as not to be deformed, whereby it is possible to prevent destruction of the connecting terminals 30.

An aligning and retaining part 86 includes a face 86a and a face 86b. The face 86a is shaped like an architrave. The face 86a is positioned inside the face 85a, one step inner than the face 85a, and substantially parallel to the upper face 81a. The face 86b is provided perpendicular to the face 86a and between the face 86a and the face 85a. The face 86b constitutes a part of the inner side surface of the frame 81.

The face 86a is in contact with the outer edge of the lower surface of the substrate 20 of the connecting terminal structure $10C_1$. The shape of the opening part formed by the faces 86b is rectangular in conformity with the plan view of the connecting terminal structure $10C_1$. Further, the shape of the opening part formed by the face 86b is slightly greater than the outer shape of the substrate 20 and the supporting body 55 to enable attaching and detaching the connecting terminal structure $10C_1$. The face 86b and the side surfaces of the substrate 20 and the supporting body 55 may contact or there may be a gap to an extent of not causing a positional shift between the connecting parts 32 being the other ends of the connecting terminals 30 on the connecting terminal group 30D in the connecting terminal structure $10C_1$ and the electrode pads 72 of the checking board 70.

Since the connecting terminal structure $10C_1$ is held by the aligning and retaining part 86, the connecting terminal structure $10C_1$ is not pressed on a side of the checking board 70 from the face 86a of the aligning and retaining part 86. As a result, it is possible to prevent the connecting terminal structure $10C_1$ from being excessively pressed on the side of the checking board 70 so as not to be deformed, so that it is possible to prevent destruction of the connecting terminals 30.

For example, the lid 82 has a substantially rectangular shape or a substantially architrave-like shape in its plan view and is made of a metal, a resin and so on. The lid 82 is attached to the upper surface 81a of the frame 81 so as to be rotatable around one end of the upper face 81a of the frame 81 and has a lock mechanism in the other end of the upper face 81a of the frame 81.

In order to achieve the state illustrated in FIG. 16, the lid 82 is rotated in a direction of making the other end of the lid 82 be apart from the upper surface 81a of the frame 81 to enable the semiconductor package 60A or the like to be arranged inside the frame 81. Then, the connecting terminal structure $10C_1$, the semiconductor package 60B, the connecting terminal structure $10C_2$ and the semiconductor package 60A are sequentially arranged inside the frame 81. Thereafter, the lid 82 is rotated in a direction of making the other end of the lid 81 be closer to the upper surface 81a of the frame 81 to fix the other end of the lid 81 to the upper surface 81a of the frame 81 by contact (a locked state). With this, the lid 82 pushes the connecting terminal structure $10C_1$, the semiconductor package 60B, the connecting terminal structure $10C_2$ and the semiconductor package 60A on the side of the checking board 70. Thus, the connecting terminal structure $10C_1$, the semiconductor package 60B, the connecting terminal structure $10C_2$ and the semiconductor package 60A are moved on the side of the checking board 70.

Specifically, the connecting terminals 30 of the connecting terminal group 30D of the connecting terminal structure $10C_1$ are compressed in a thickness direction to cause a predetermined spring force, and the connecting parts 32 of the connecting terminals 30 are in contact with the electrode pads of the checking board 70. Specifically, the connecting terminals 30 of the connecting terminal group 30C of the connecting terminal structure $10C_1$ are compressed in a thickness direction to cause a predetermined spring force, and the connecting parts 32 of the connecting terminals 30 are in contact with the electrode pads 64 of the semiconductor package 60B.

Similarly, the connecting parts 32 of the connecting terminals 30 of the connecting terminal group 30D of the connecting terminal structure $10C_2$ are pressed in a thickness direction to cause a predetermined spring force, and the connecting parts 32 of the connecting terminals 30 are in contact with the electrode pads 65 of the semiconductor package 60B. Similarly, the connecting terminals 30 of the connecting terminal group 30D of the connecting terminal structure $10C_2$ are pressed in a thickness direction to cause predetermined spring force, and the connecting parts 32 of the connecting terminals 30 are in contact with the electrode pads 64 of the semiconductor package 60A.

As a result, the semiconductor package 60B is electrically connected to the semiconductor package 60A via the connecting terminal structure $10C_2$ thereby realizing a similar connecting state to that in the semiconductor package 100 illustrated in FIG. 15. Further, the semiconductor package 60B, the connecting terminal structure $10C_2$ and sealing resin the semiconductor package 60A corresponding to the semiconductor package 100 are electrically connected to the checking board 70 via the connecting terminal structure $10C_1$. Said differently, the semiconductor package 60B, the connecting terminal structure $10C_2$ and of the semiconductor package 60A corresponding to the semiconductor package 100 can be electrically checked. By releasing the locking of the lid 82 after this checking, the semiconductor packages 60A and 60B and the connecting terminal structures $10C_1$ and $10C_2$ can be removed from the frame 81.

The lid 82 may be separable from the frame 81. In this case, for example, the lid 82 may be fixed to the frame 81 while the semiconductor package 60A, 60B is pushed with pressure from the upper side of the semiconductor package 60A by the lid 82.

As described, with the second embodiment, the semiconductor package 60A and the semiconductor package 60B constituting the semiconductor package 100 are electrically connected via the connecting terminal structure $10C_2$, and the semiconductor packages 60A and 60B are electrically connected to the checking board 70 via the connecting terminal structure $10C_1$. With these, the semiconductor packages 60A and 60B are temporarily connected before mutually joining these to thereby realize an electric checking of the semiconductor package 100. As a result, it becomes possible to complete the semiconductor package 100 by mutually joining the semiconductor packages 60A and 60B only in a case where both of the semiconductor packages 60A and 60B are determined to be good.

In a case where an object to be checked does not include a high component as the semiconductor packages 60A and 60B, the connecting terminal structure 10 or 10A having no opening portion in the vicinity of the central part may be used instead of the connecting terminal structure 10C.

Modified Example 1 of Second Embodiment

Within the modified example of the second embodiment, there is described an example of performing an electric check for a semiconductor package different from the second embodiment using the connecting terminal structure 10C of the modified example 3 of the first embodiment. In the modified example 1 of the second embodiment, explanation of components the same as those described in the above description of the first embodiment is omitted.

Figure 17:
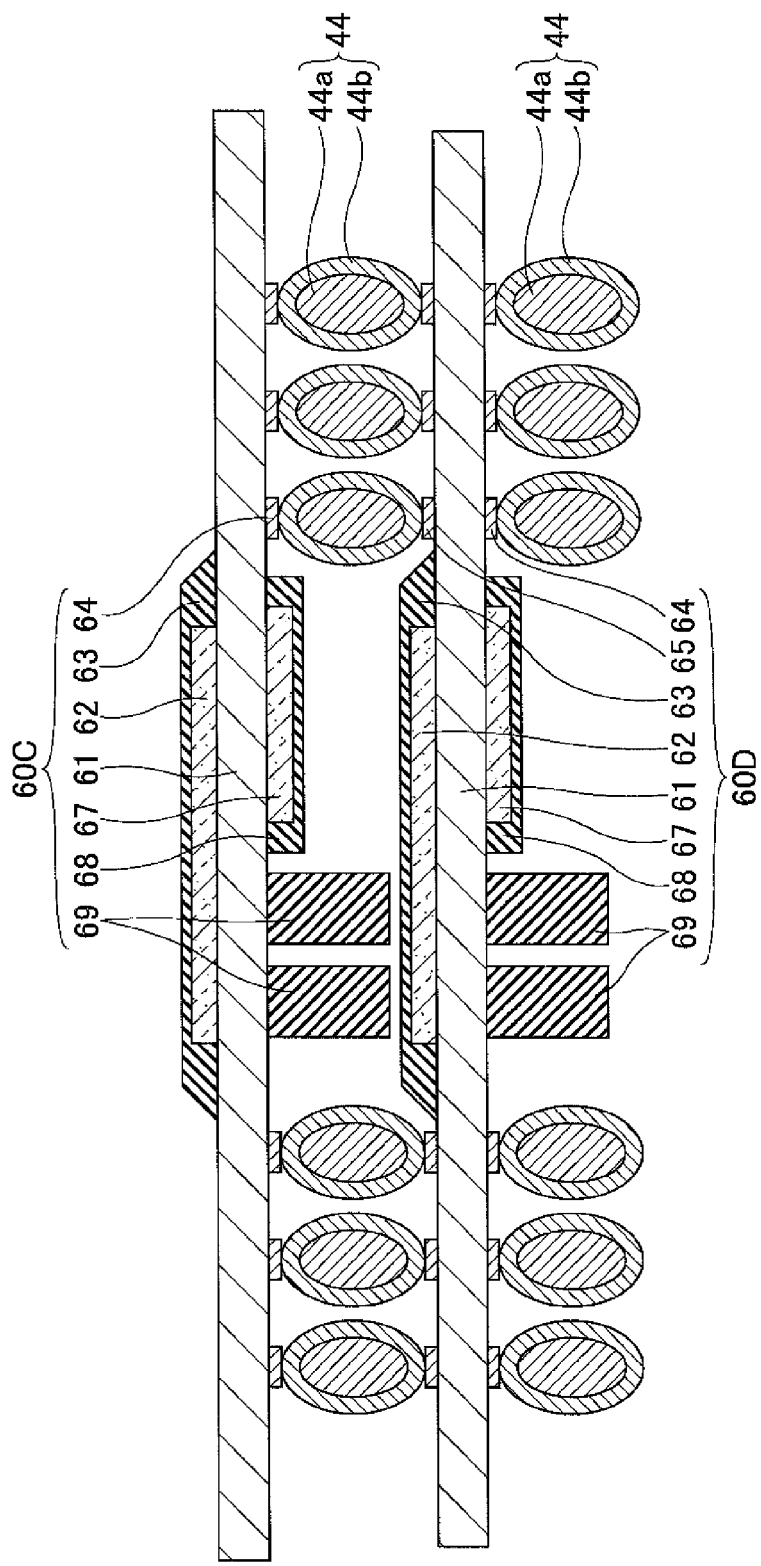
FIG. 17 is a cross-sectional view of another semiconductor package to be checked.

FIG. 17 is a cross-sectional view of a semiconductor package to be checked. Referring to FIG. 17, the semiconductor package 100 has a package on package (POP) structure where a semiconductor package 60C is laminated via joining parts 44 on the semiconductor package 60D.

The semiconductor package 60C is a Land Grid Array (LGA) including a substrate 61, a semiconductor chip 62, a encapsulation resin 63, electrode pads 64, a semiconductor chip 67, a encapsulation resin 68 and electronic parts 69. The substrate 61, the semiconductor chip 62, the encapsulation resin 63 and the electrode pads 64 are similar to those in the semiconductor package 60A. Therefore, the explanation is omitted. The semiconductor package 60C has a structure in which the semiconductor chip 67 and the electronic parts 69 are mounted on another surface of the substrate 61 of the semiconductor package 60A and the semiconductor chip 67 is sealed by a encapsulation resin 68. The electronic parts 69 protrude in a direction perpendicular to the other surface of the substrate 61 more (higher) than the semiconductor chip 67 sealed by the encapsulation resin 68. The electronic parts 69 are, for example, a capacitor, an inductor, a resistor or the like.

The semiconductor package 60D is a so-called Land Grid Array (LGA) including a substrate 61, a semiconductor chip 62, a encapsulation resin 63, electrode pads 64, electrode pads 65, a semiconductor chip 67, a encapsulation resin 68 and electronic parts 69. The substrate 61, the semiconductor chip 62, the encapsulation resin 63, the electrode pads 64 and the electrode pads 65 are similar to those in the semiconductor package 60B. Therefore, the explanation is omitted. The semiconductor package 60D has a structure in which the semiconductor chip 67 and the electronic parts 69 are mounted on another surface of the substrate 61 of the semiconductor package 60B of the second embodiment illustrated in FIG. 15 and the semiconductor chip 67 is sealed by a encapsulation resin 68. Although the joining parts 44 (bumps) are formed below the electrode pads 64 of the semiconductor package 60D in FIG. 17, the joining parts 44 (the bumps) may not be formed. In this case, the joining parts 44 (the bumps) may be formed on a side of, for example, a mounting board where the semiconductor package 60D is connected.

The electrode pads 65 in the semiconductor package 60D are electrically connected to the electrode pads 64 of the semiconductor package 60C via the joining parts 44. The joining part 44 may be a copper core solder ball which is formed by coating the periphery of the core part 44a with a solder 44. The semiconductor chip 67 of the semiconductor package 60D may have the same function as or a different function from that of the semiconductor chip 67 of the semiconductor package 60C.

When the semiconductor package 100A undergoes the electric check in a similar manner to the second embodiment, the connecting terminal structure 10C is used to electrically check the semiconductor packages 60C and 60D before joining the semiconductor packages 60C and 60D. Hereinafter, an exemplary connection of the semiconductor packages 60C and 60D to the connecting terminal structure 10C is described.

Figure 18:
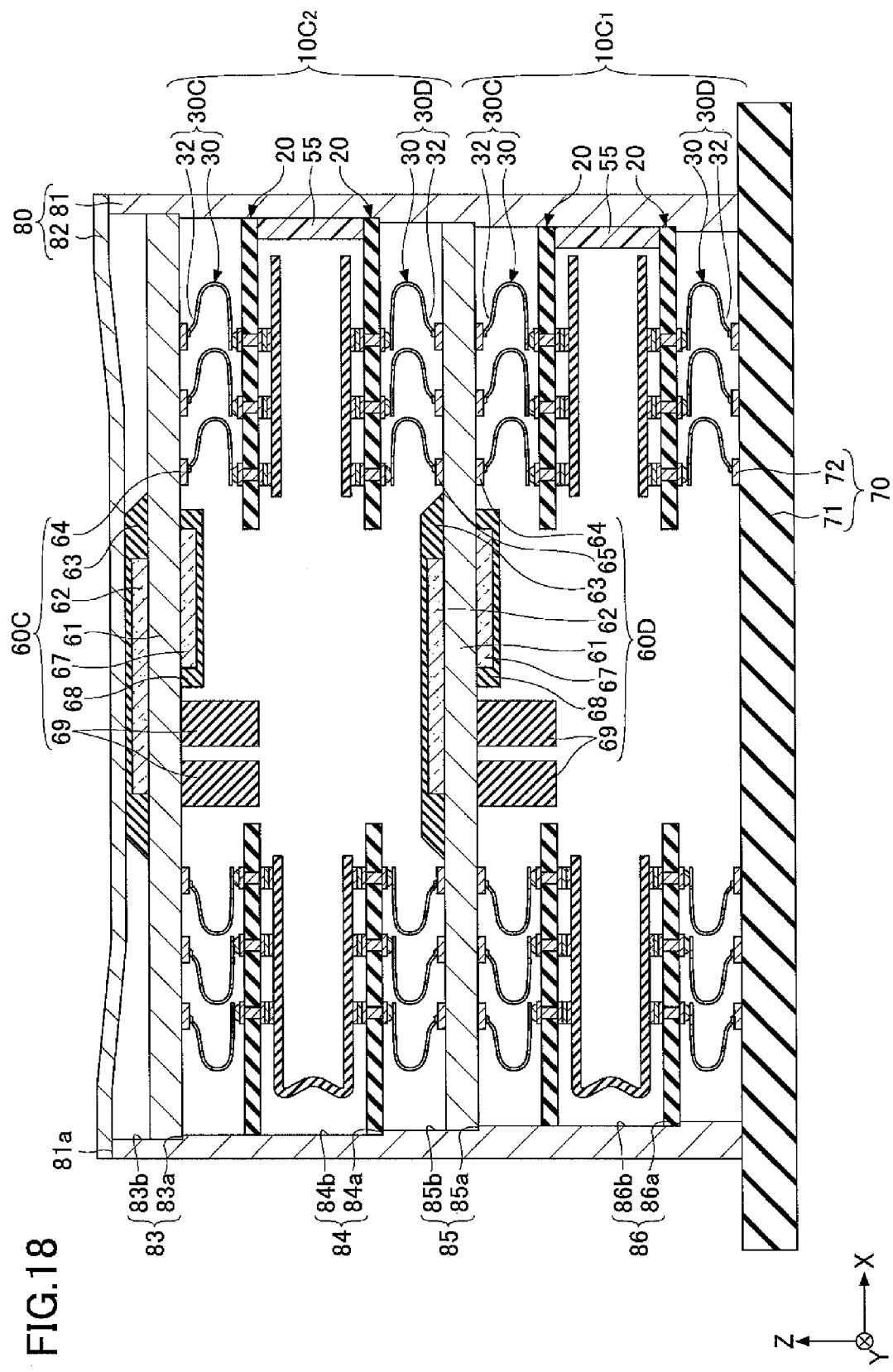
FIG. 18 is a cross-sectional view of exemplary connection of the semiconductor package for electrically checking the semiconductor package.

FIG. 18 is a cross-sectional view of an exemplary connection of the semiconductor package for electrically checking the semiconductor package. Referring to FIG. 18, a checking board 70, a connecting terminal structure $10C_1$, a semiconductor package 60D, a connecting terminal structure $10C_2$ and a semiconductor package 60C are sequentially laminated and are held by a casing 80. Said differently, the components illustrated in FIG. 18 are changed from the semiconductor package 60A to the semiconductor package 60C and from the semiconductor package 60B to the semiconductor package 60D. The connecting terminal structure $10C_1$, the connecting terminal structure $10C_2$ and the casing 80 are a typical example of a socket of the second embodiment.

As a result, the semiconductor package 60D is electrically connected to the semiconductor package 60C via the connecting terminal structure $10C_2$, thereby realizing a similar connecting state to that in the semiconductor package 100A illustrated in FIG. 17. Further, the semiconductor package 60D, the connecting terminal structure $10C_2$ and a laminated body of the semiconductor package 60C corresponding to the semiconductor package 100A are electrically connected to the checking board 70 via the connecting terminal structure $10C_1$. Said differently, the semiconductor package 60D, the connecting terminal structure $10C_2$ and the laminated body of the semiconductor package 60C corresponding to the semiconductor package 100A can be electrically checked.

With the modified example 1 of the second embodiment, effects similar to those in the second embodiment are obtainable. Further, the following effects are obtainable. Said differently, even if a high component such as the electronic part 69 is mounted on the semiconductor package 60C or 60D, by providing the electronic part 69 inside the opening part formed in the vicinity of the central part of the connecting terminal structure $10C_1$ or $10C_2$, the semiconductor package 60C can be electrically connected to the semiconductor package 60D.

Modified Example 2 of Second Embodiment

Within the modified example 2 of the second embodiment, there is described an example of performing an electric check for a semiconductor package different from the second embodiment and the modified example 1 of the second embodiment using the connecting terminal structure 10C of the modified example 3 of the first embodiment. In the modified example 2 of the second embodiment, explanation of components the same as those described in the above description of the first embodiment is omitted.

Figure 19:
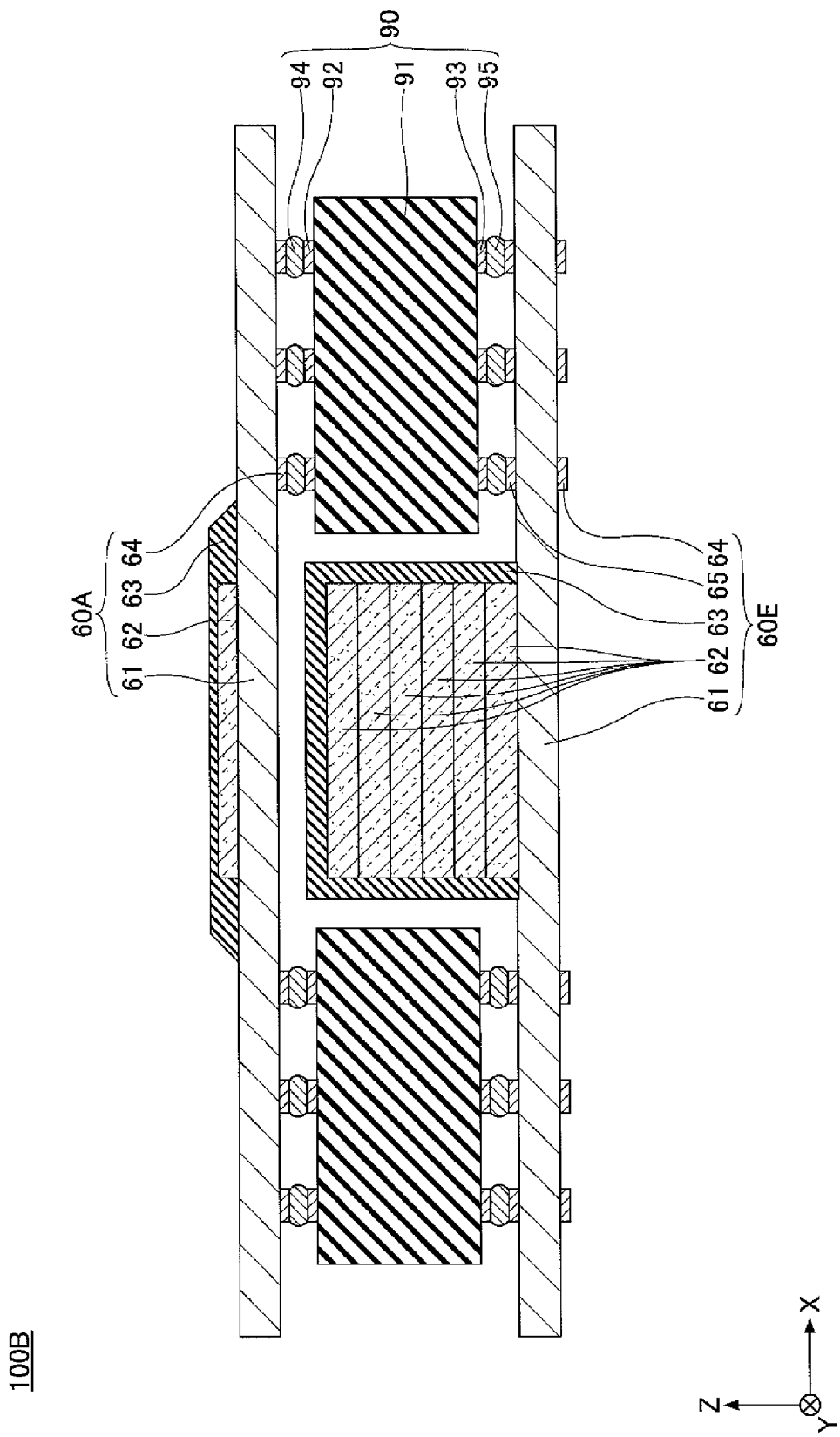
FIG. 19 is a cross-sectional view of another semiconductor package to be checked.

FIG. 19 is a cross-sectional view of a semiconductor package to be checked. Referring to FIG. 19, the semiconductor package 100B has a package on package (POP) structure where a semiconductor package 60A is mounted via a relay board 90 on a semiconductor package 60E.

The semiconductor package 60E is a Land Grid Array (LGA) including a substrate 61, plural laminated semiconductor chips 62, a encapsulation resin 63, electrode pads 64 and electrode pads 65. The substrate 61, the encapsulation resin 63, the electrode pads 64 and the electrode pads 65 are similar to those in the semiconductor package 60B. Therefore, the explanation is omitted. The plural laminated semiconductor chips 62 have through electrodes and are mutually connected by the through electrodes.

The electrode pads 65 in the semiconductor package 60E are electrically connected to the electrode pads 64 of the semiconductor package 60A via the relay board 90. The relay board 90 includes a substrate body 91, plural electrode pads 92 formed on one surface of the substrate body 91, joining parts 94 formed on the electrode pads 92, plural electrode pads 93 formed on the other surface of the substrate body 91 and joining parts 95 formed on the electrode pads 93. The electrode pads 92 and the electrode pads 93 are electrically connected by the through wirings (not illustrated) penetrating through the substrate body 91. Materials of the substrate body 91 and the electrode pads 92 and 93 of the relay board 90 may be similar to those of the substrate 20 and electrode pads 22 and 23 of the substrate body 21. The materials of the joining parts 94 and 95 of the relay board 90 may be similar to those of the joining part 40. The semiconductor chip 62 of the semiconductor package 60E may have the same function as or a different function from the semiconductor chip 62 of the semiconductor package 60A.

When the semiconductor package 100E undergoes the electric check, in a similar manner to the second embodiment, the connecting terminal structure 10C is used to electrically check the semiconductor packages 60A and 60E before joining the semiconductor packages 60A and 60E. Hereinafter, an exemplary connection of the semiconductor packages 60A and 60E to the connecting terminal structure 10C is described.

Figure 20:
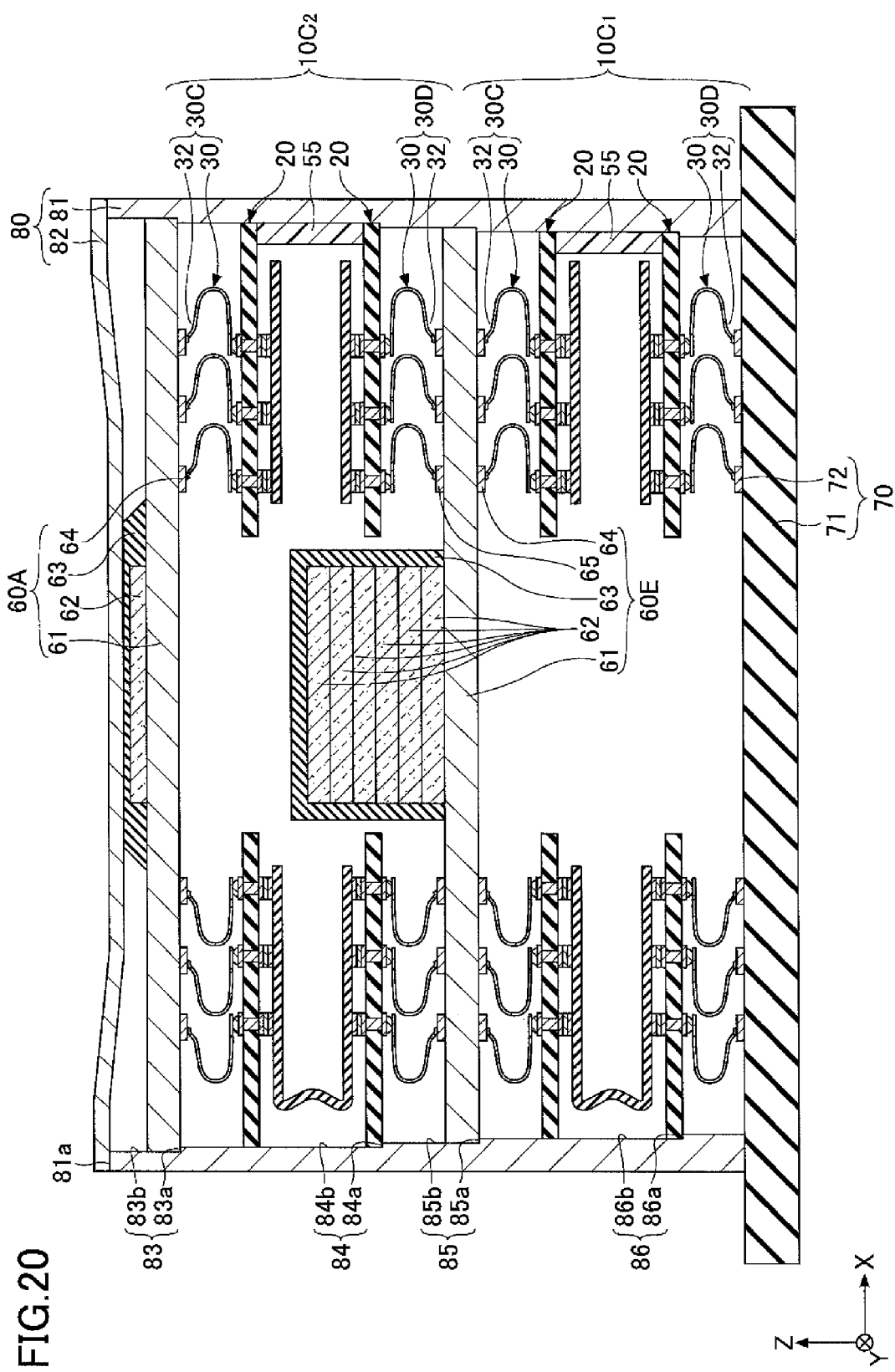
FIG. 20 is a cross-sectional view of exemplary connection of the semiconductor package for electrically checking the semiconductor package.

FIG. 20 is a cross-sectional view of an exemplary connection of the semiconductor package for electrically checking the semiconductor package. Referring to FIG. 20, a checking board 70, a connecting terminal structure $10C_1$, the semiconductor package 60E, a connecting terminal structure $10C_2$ and the semiconductor package 60A are sequentially laminated and are held by a casing 80. Said differently, the semiconductor package 60B in FIG. 16 is replaced by the semiconductor package 60E in the components illustrated in FIG. 20. The connecting terminal structure $10C_1$, the connecting terminal structure $10C_2$ and the casing 80 are typical example of the socket of the second embodiment.

In a similar manner to the second embodiment, the semiconductor package 60E is electrically connected to the semiconductor package 60A via the connecting terminal structure $10C_2$ thereby realizing a similar connecting state to that in the semiconductor package 100B illustrated in FIG. 19. Further, the semiconductor package 60E, the connecting terminal structure $10C_2$ and a laminated body of the semiconductor package 60A corresponding to the semiconductor package 100B are electrically connected to the checking board 70 via the connecting terminal structure $10C_1$. Said differently, the semiconductor package 60E, the connecting terminal structure $10C_2$ and the laminated body of the semiconductor package 60A corresponding to the semiconductor package 100B can be electrically checked.

With the modified example 2 of the second embodiment, effects similar to those in the second embodiment are obtainable. Further, the following effects are obtainable. Said differently, when the plural semiconductor chips 62 are laminated to be high as in the semiconductor package 60E, by arranging the laminated semiconductor chips 62 inside the opening part formed in the vicinity of the central part of the connecting terminal structure $10C_2$, it becomes possible to electrically connect the semiconductor package 60E to the semiconductor package 60A.

Within the second embodiment, the modified example 1 of the second embodiment and the modified example 2 of the second embodiment, the supporting bodies 55 are illustrated to have the same height. However, in the connecting terminal structure of the embodiments, the height of the supporting bodies 55 can be easily changed to thereby prepare plural connecting terminal structures having different heights and one of the prepared connecting terminal structures can be selected depending on the height of the object to be connected. Thus, it is possible to easily realize various connecting terminal structures and various sockets having various heights.

[c] Third Embodiment

Within the third embodiment, an exemplary electronic component package constituted by the connecting terminal structure 10C of the modified example 3 of the first embodiment is illustrated. In the third embodiment, explanation of components the same as those described in the above description of the first and second embodiments is omitted.

Figure 21:
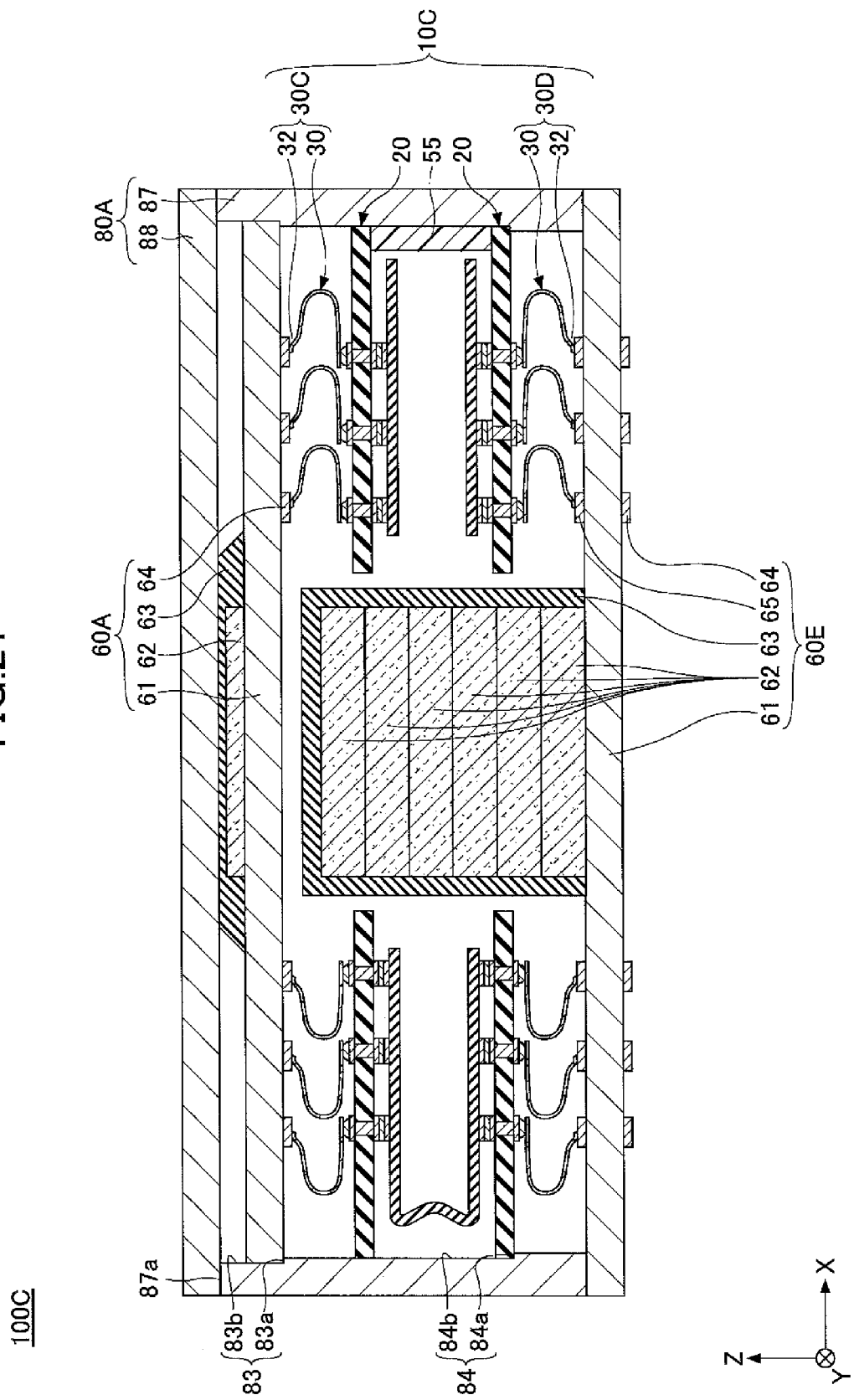
FIG. 21 is a cross-sectional view of a semiconductor package of a third embodiment.

FIG. 21 is a cross-sectional view of the electronic component package of the third embodiment. Referring to FIG. 21, the electronic component package 100C has a package on package (POP) structure where the electronic component package 100C is formed by laminating a semiconductor package 60A on a semiconductor package 60E via a connecting terminal structure 10C and holding the laminated structure in a casing 80A. The electronic component package of the third embodiment may have a structure in which a semiconductor chip is included (a semiconductor package) or a structure in which wiring boards without semiconductor chips are connected.

The casing 80A includes a frame 87 and a lid 88. The frame 87 is shaped like an architrave having a substantially rectangular opening in a center of the frame 81 and has aligning and retaining parts 83 and 84. The frame 81 is made of a metal, a resin or the like having rigidity. For example, the bottom surface of the frame 87 is fixed to an outer edge portion on one surface of the substrate 61 of the semiconductor package 60E. The frame 87 may be mechanically fixed to the substrate 61 of the semiconductor package 60E by using screws or the like.

The frame 87 has functions of positioning and holding the connecting terminal structure 10C and the semiconductor package 60A to thereby mutually aligning these. The frame 87 has functions of preventing the interval between the connecting terminal structure 10C and the semiconductor package 60A from being a predetermined value or smaller.

The lid 88 is separable from the frame 87. The lid 88 is fixed to an upper surface 87a of the frame 87 in a state that the lid 88 presses sequentially arranged the connecting terminal structure 10C, the semiconductor package 60A and the semiconductor package 60E inside the frame 87. However, Instead of adopting the structure of enabling to fix the lid 88 to the upper surface 87a of the frame 87, the lid 88 may be rotatable and have a locking mechanism in a manner similar to the lid 82. By employing the above structure, the electronic component package 100C can be easily repaired.

Similarly, the connecting terminals 30 of the connecting terminal group 30D of the connecting terminal structure 10C are pressed in a thickness direction to cause a predetermined spring force, and the connecting parts 32 of the connecting terminals 30 are in contact with the electrode pads 65 of the semiconductor package 60E. Similarly, the connecting terminals 30 of the connecting terminal group 30C of the connecting terminal structure 10C are pressed in a thickness direction to cause a predetermined spring force, and the connecting parts 32 of the connecting terminals 30 are in contact with the electrode pads 64 of the semiconductor package 60A. As described, the semiconductor package 60E is electrically connected to the semiconductor package 60A via the connecting terminal structure 10C.

Within the third embodiment, the electronic component package 100C constituted by the connecting terminal structure 10C of the modified example 3 of the first embodiment can be realized. Said differently, since the height of the supporting body can be easily changed in the connecting terminal structure of the third embodiment, a high object to be connected such as the semiconductor package 60E can be easily connected to the other object to be connected.

Within the second embodiment, the checking board 70 and the semiconductor package 60A are connected by the socket of the embodiments. However, the semiconductor package 60A may be connected to a mounting board such as a motherboard by the socket of the embodiments.

Further, the modified examples 1 to 3 of the first embodiment may be appropriately combined.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiments of the present invention have been described in detail, it should be understood that the various changes, substitutions, and alterations could be made hereto without departing from the spirit and scope of the invention.

What is claimed is:

1. A connecting terminal structure comprising:
    a first substrate having a first surface and a second surface opposite to the first surface;
    a first electrode pad formed on the first surface of the first substrate;
    a second electrode pad formed on the second surface of the first substrate;
    a second substrate having a third surface and a fourth surface opposite to the third surface;
    a third electrode pad formed on the third surface of the second substrate;
    a fourth electrode pad formed on the fourth surface of the second substrate;
    a supporting body provided between the second surface of the first substrate and the third surface of the second substrate, the supporting body directly contacting and being directly connected to an outer peripheral edge of the second surface of the first substrate and an outer peripheral edge of the third surface of the second substrate;
    a flexible substrate arranged so as to electrically connect the second electrode pad formed on the second surface of the first substrate to the third electrode pad formed on the third surface of the second substrate, the flexible substrate being disposed inside an area which is surrounded by the supporting body, the second surface of the first substrate, and the third surface of the second substrate; and
    a connecting terminal connected to at least one of the first electrode pad formed on the first surface of the first substrate and the fourth electrode pad formed on the fourth surface of the second substrate;
    wherein the supporting body is made of an insulating material.

2. The connecting terminal structure according to claim 1, the connecting terminal structure further comprising:
    a fifth electrode pad formed on a fifth surface of the flexible substrate at one end of the flexible substrate; and
    a sixth electrode pad formed on the fifth surface of the flexible substrate at another end of the flexible substrate,
    wherein the flexible substrate has a sixth surface opposite to the fifth surface, and
    wherein the fifth electrode pad is connected to the second electrode pad formed on the second surface of the first substrate, and
    the sixth electrode pad is connected to the third electrode pad formed on the third surface of the second substrate.

3. The connecting terminal structure according to claim 2, wherein the flexible substrate is bent between the one end and the another end.

4. The connecting terminal structure according to claim 1, wherein the supporting body is shaped like a letter U in a plan view of the connecting terminal structure and shaped like a plate in a side view of the connecting terminal structure.

5. The connecting terminal structure according to claim 1, wherein the connecting terminal is a conductive member having a spring property.

6. The connecting terminal structure according to claim 1, wherein the connecting terminal includes
    a fixing part formed at one end of the connecting terminal, the fixing part being connected to the first electrode pad,
    a connecting part formed at another end of the connecting terminal opposite to the one end of the connecting terminal, and
    a spring part arranged between the fixing part and the connecting part, the spring part having a curved shape,
    wherein the fixing part, the connecting part, and the spring part are integrally formed.

7. The connecting terminal structure according to claim 1, wherein the flexible substrate includes a first part parallel to the first substrate, a second part parallel to the supporting body, and a third part parallel to the second substrate, and the first, second, and third parts are sequentially connected.

8. The connecting terminal structure according to claim 1, wherein the connecting terminal includes
    an end electrically connected to the first electrode pad formed on the first surface of the first substrate or the fourth electrode pad formed on the fourth surface of the second substrate, and
    another end provided to be electrically contacted with an object to be connected so as not to be fixed to the object to be connected.

* * * * *